US009583725B2

(12) United States Patent
Lee

(10) Patent No.: US 9,583,725 B2
(45) Date of Patent: Feb. 28, 2017

(54) CONDUCTIVE THIN FILM, METHOD FOR PRODUCING SAME, AND ELECTRONIC ELEMENT COMPRISING SAME

(71) Applicant: POSTECH ACADEMY-INDUSTRY FOUNDATION, Pohang-si, Gyeongsangbuk-do (KR)

(72) Inventor: Tae-Woo Lee, Pohang-si (KR)

(73) Assignee: POSTECH ACADEMY-INDUSTRY FOUNDATION, Pohang-si, Gyeongsangbuk-do (KR)

( * ) Notice: Subject to any disclaimer, the term of this patent is extended or adjusted under 35 U.S.C. 154(b) by 0 days.

(21) Appl. No.: 14/771,479

(22) PCT Filed: Feb. 21, 2014

(86) PCT No.: PCT/KR2014/001433

§ 371 (c)(1),
(2) Date: Aug. 28, 2015

(87) PCT Pub. No.: WO2014/133285

PCT Pub. Date: Sep. 4, 2014

(65) Prior Publication Data

US 2016/0005988 A1 Jan. 7, 2016

(30) Foreign Application Priority Data

Feb. 28, 2013 (KR) ........................ 10-2013-0022497

(51) Int. Cl.
*H01L 51/44* (2006.01)
*H01L 51/00* (2006.01)
(Continued)

(52) U.S. Cl.
CPC .......... *H01L 51/441* (2013.01); *C08L 101/12* (2013.01); *H01B 1/122* (2013.01);
(Continued)

(58) Field of Classification Search
CPC ............. H01L 51/0021; H01L 51/0037; H01L 51/424; H01L 51/441; H01L 51/5088; H01L 51/5206; H01L 51/0085
See application file for complete search history.

(56) References Cited

U.S. PATENT DOCUMENTS 5,981,864 A * 11/1999 Mizutani ........... H01L 31/03921 136/244
2003/0189216 A1* 10/2003 Kamatani .............. C09K 11/06 257/98

FOREIGN PATENT DOCUMENTS

KR 10-2003-0094063 A 12/2003
KR 10-2007-0078595 A 8/2007
(Continued)

OTHER PUBLICATIONS

International Search Report dated May 20, 2014 of PCT/KR2014/001433 which is the parent application—4 pages.

*Primary Examiner* — Susan D Leong
(74) *Attorney, Agent, or Firm* — Knobbe Martens Olson & Bear, LLP

(57) ABSTRACT

Provided are a conductive thin film, a method for producing same, and an electronic element comprising same. The conductive thin film has excellent conductivity, allows the easy adjustment of a work function, also allows easy film formation, and thus can be advantageously used in various electronic elements, such as organic light-emitting devices and organic solar cells.

21 Claims, 3 Drawing Sheets

(51) Int. Cl.

| | |
|---|---|
| ***H01L 27/32*** | (2006.01) |
| ***C08L 101/12*** | (2006.01) |
| ***H01B 1/12*** | (2006.01) |
| ***H01L 51/50*** | (2006.01) |
| ***H01L 51/42*** | (2006.01) |
| ***H01L 51/52*** | (2006.01) |

(52) U.S. Cl.
CPC ...... *H01L 51/0021* (2013.01); *H01L 51/0037* (2013.01); *H01L 51/424* (2013.01); *H01L 51/5088* (2013.01); *H01L 51/5206* (2013.01); *H01L 51/0085* (2013.01); *Y02E 10/549* (2013.01)

(56) References Cited

FOREIGN PATENT DOCUMENTS

| | | | |
|---|---|---|---|
| KR | 10-2010-0076662 | A | 7/2010 |
| KR | 10-2012-0095992 | A | 8/2012 |

* cited by examiner

CONDUCTIVE THIN FILM, METHOD FOR PRODUCING SAME, AND ELECTRONIC ELEMENT COMPRISING SAME

TECHNICAL FIELD

The present invention relates to a conductive thin film, a method for producing the same, and an electronic element including the same.

BACKGROUND ART

An organic light-emitting device is an emissive device that has advantages in that it has a wide viewing angle, excellent contrast, and a rapid response time, shows excellent characteristics such as brightness, driving voltage, and response speed, and becomes polychromatic.

A typical organic light-emitting device may include an anode, a cathode, and an organic layer sandwiched between the anode and the cathode. The organic layer may include an electron injection layer, a hole transport layer, a light emitting layer, an electron transport layer, and a cathode. When a voltage is applied between the anode and the cathode, holes injected from the anode move to the light emitting layer via the hole transport layer, and electrons injected from the cathode move to the light emitting layer via the electron transport layer. Carriers such as the holes and the electrons are recombined in a portion of the light emitting layer to generate excitons. In this case, light is emitted as the excitons radiatively decay from an excited state to a ground state.

Meanwhile, at this point of time at which there is an increasing interest in new renewable energy all over the world, organic solar cells having possibilities and various advantages as future energy sources have come into the spotlight. The organic solar cells may be produced at small thickness and low manufacturing costs, compared to the inorganic solar cells using silicon, and thus may be widely applied to various flexible devices in the future.

There is a demand for development of conductive thin films which allow easy film formation while satisfying a work function, conductivity, and the like, which are required for the separate electronic elements such as the organic light-emitting devices, and the organic solar cells. Such conductive thin films can be used as layers configured to compensate for a low work function (4.6 to 4.9 eV) of indium tin oxide (ITO) to improve hole injection or extraction for conventional transparent metal oxide electrodes (i.e., ITO electrodes), and can also be independently used as transparent electrodes instead of the metal oxide electrodes. In particular, since the price of ITO electrodes continues to increase due to the issues regarding to the exhaustion of indium resources, research on materials replacing the indium resources has been urgently required. For this reason, although different types of materials for transparent electrodes replacing the materials for conventional ITO transparent electrodes have been developed, the materials for transparent electrodes having a satisfactory work function remain to be found. Also, since the conventional ITO transparent electrodes tend to be easily broken due to their mechanical instability when they are bent, it is difficult to apply them to flexible electronic elements. Accordingly, there is a demand for development of transparent flexible electrodes.

DISCLOSURE

Technical Problem

Therefore, it is an aspect of the present invention to provide a conductive thin film which has excellent conductivity, and enables easy adjustment of a work function, a method for producing the conductive thin film, and an electronic element using the same.

Technical Solution

According to one aspect of the present invention, there is a provided a conductive thin film including a conductive layer and a surface energy-tuning layer. Here, the conductive layer includes a conductive polymer and a first fluorine-based material, the surface energy-tuning layer includes a second fluorine-based material, but does not include the conductive polymer, and the first fluorine-based material and the second fluorine-based material are the same or different from each other.

According to another aspect of the present invention, there is a provided a method for producing the conductive thin film. Here, the method includes providing a first mixture, which includes a conductive polymer, a first fluorine-based material, and a first solvent, onto a substrate and removing at least a portion of the first solvent to form a conductive layer, and providing a second mixture, which includes a second fluorine-based material and a second solvent, onto the conductive layer and removing at least a portion of the second solvent to form a surface energy-tuning layer.

According to still another aspect of the present invention, there is a provided an electronic element including the conductive thin film.

The electronic element may be an organic light-emitting devices, an organic solar cell, an organic transistor, an organic memory device, an organic photodetector, or an organic CMOS sensor.

Advantageous Effects

The conductive thin film has excellent conductivity, enables easy adjustment of a work function, and allows easy film formation, and thus can be advantageously used in various electronic elements, such as organic light-emitting devices, and organic solar cells.

EMBODIMENTS

Hereinafter, embodiments of the present invention will be described in detail with reference to the accompanying drawings.

Figure 1:
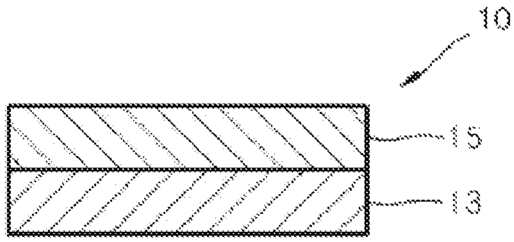
FIG. 1 is a schematic cross-sectional view of a conductive thin film according to one embodiment of the present invention.

FIG. 1 is a diagram schematically showing a cross section of a conductive thin film 10 according to one embodiment of the present invention. The conductive thin film 10 includes a conductive layer 13, and a surface energy-tuning layer 15. The conductive layer 13 includes a conductive polymer and a first fluorine-based material. The surface energy-tuning layer 15 includes a second fluorine-based material, but does not include the conductive polymer included in the conductive layer 13. The first fluorine-based material and the second fluorine-based material may be the same or different from each other.

The conductive polymer of the conductive layer 13 may, for example, include polythiophene, polyaniline, polypyrrole, polystyrene, polyethylenedioxythiophene, polyacetylene, polyphenylene, polyphenylvinylene, polycarbazole, a copolymer including two or more different repeating units thereof, a derivative thereof, or a blend of two or more types thereof.

The copolymer includes a copolymer in which all the different repeating units of conductive polymers consisting the copolymer are included in the main chain thereof, a graft-type copolymer in which one of the different repeating units of the conductive polymers is included in a side chain, etc. Also, the copolymer may be a random copolymer, an alternative copolymer, or a block copolymer.

The derivative may include a conductive polymer having an ionic group bound thereto, a conductive polymer bound to a polymeric acid containing an ionic group via the ionic group (for example, via an ionic bond), etc. Therefore, the conductive polymer may include a self-doped conductive polymer doped with one or more types of an ionic group, and a polymer.

The ionic group may include an anionic group, and a cationic group disposed to counter the anionic group.

For example, the anionic group may be selected from the group consisting of $PO_3^{2-}$, $SO_3^-$, $COO^-$, $I^-$, $CH_3COO^-$, and $BO_2^{2-}$.

Meanwhile, the cationic group may include at least one type of a metal ion, and an organic ion. The metal ion may be selected from the group consisting of $Na^+$, $K^+$, $Li^+$, $Mg^{+2}$, $Zn^{+2}$, and $Al^{+3}$, and the organic ion may be selected from the group consisting of $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (R is $CH_3(CH_2)_n$—; and n is an integer ranging from 0 to 50), but the present invention is not limited thereto.

The polymeric acid may be a conductive polymer in which the ionic group as described above is bound to a side chain. In this case, the conductive polymer may be readily recognized from polymers 1 to 25 to be described below.

For example, specific examples of the conductive polymer are as described below, but the present invention is not limited thereto:

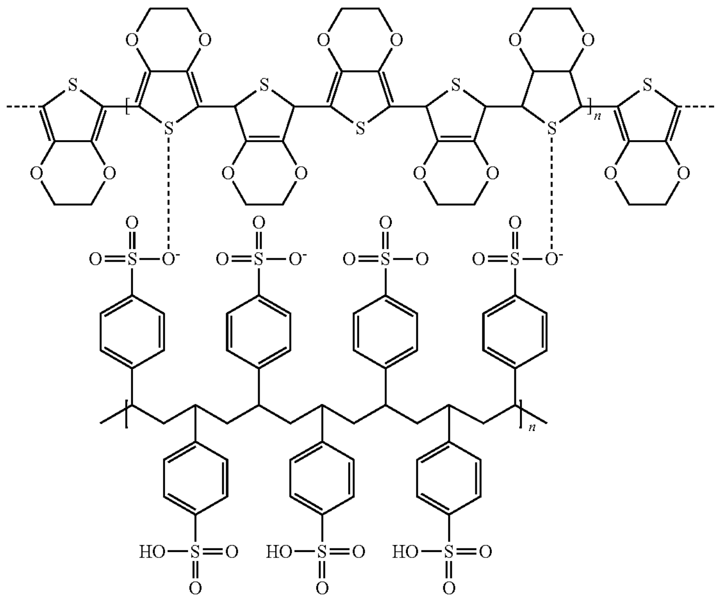

<Polymer 1 (PEDOT: PSS)>

-continued
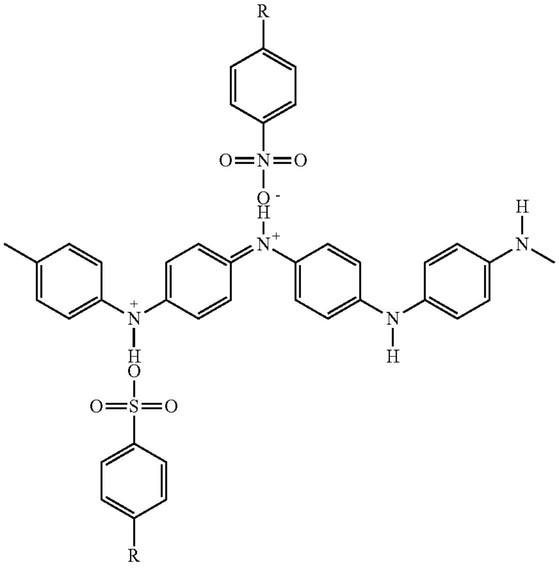
<Polymer 2(PAN DBSA)>
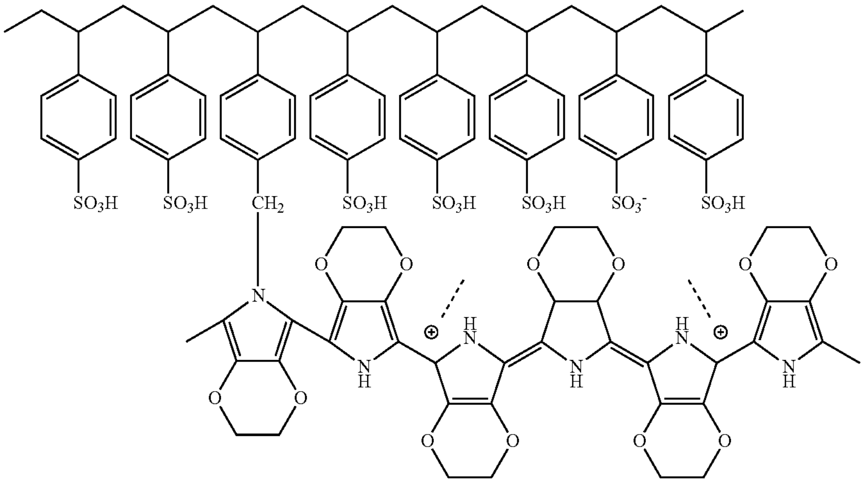
<Polymer 3>
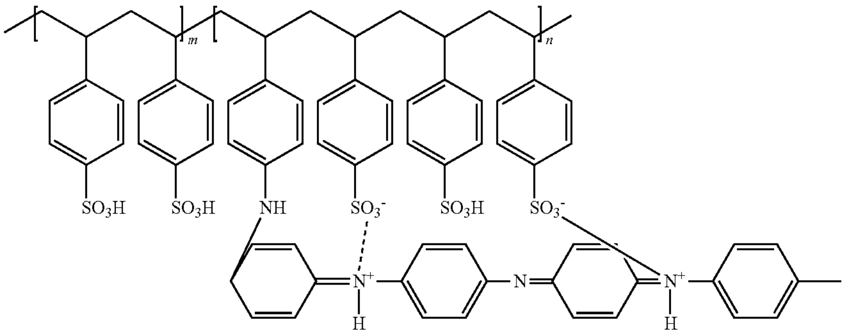
<Polymer 4 (PSS-g-PANI)>

-continued
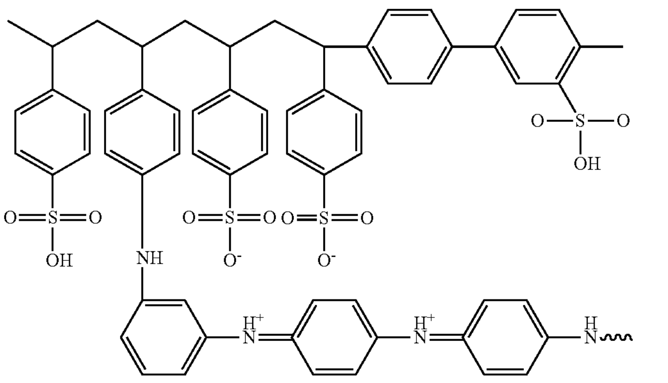
<Polymer 5>
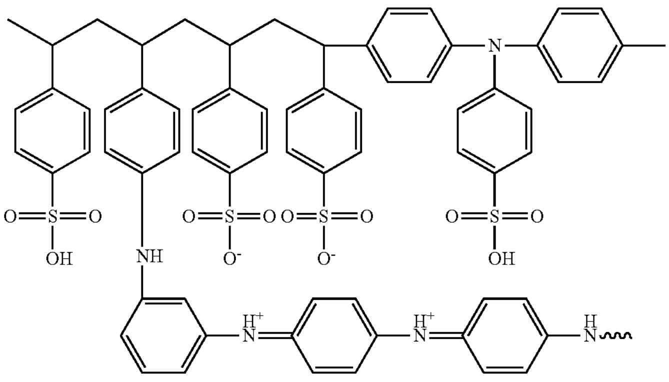
<Polymer 6>
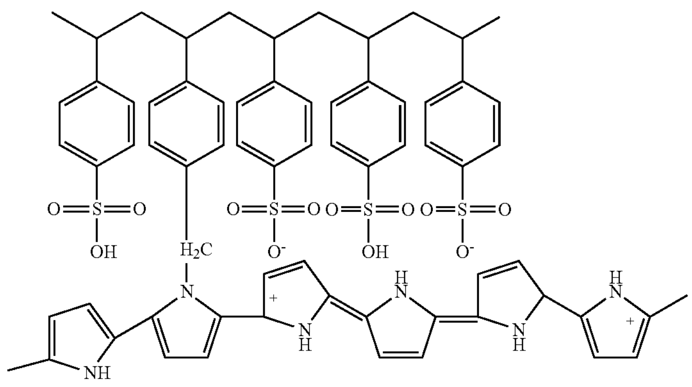
<Polymer 7>

-continued
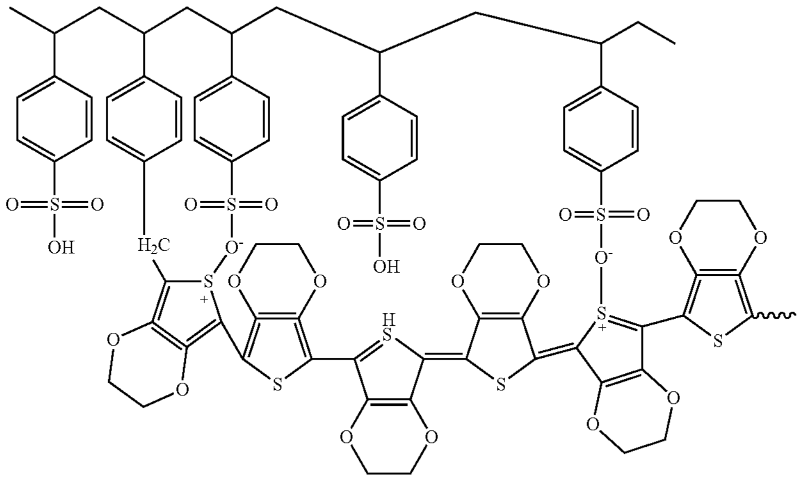
<Polymer 8>
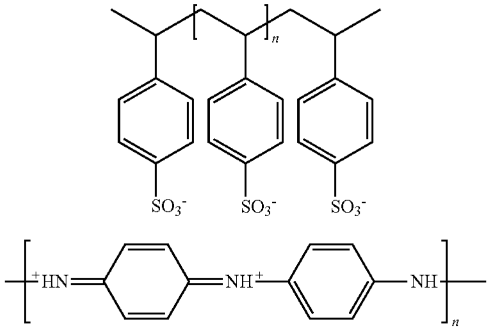
<Polymer 9 (PANI:PSS)>
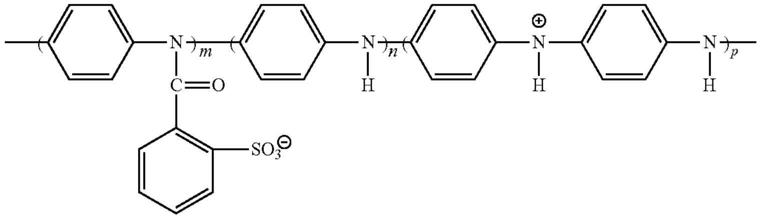
<Polymer 10>
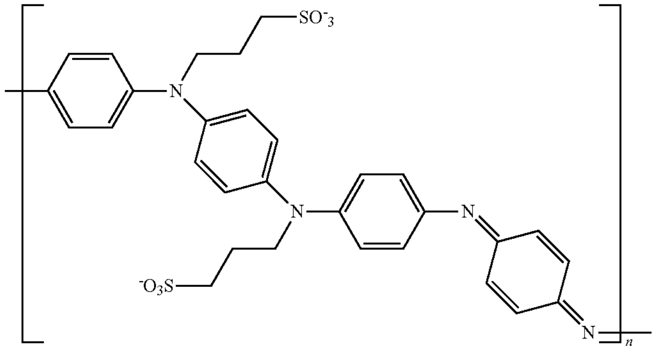
<Polymer 11>

-continued
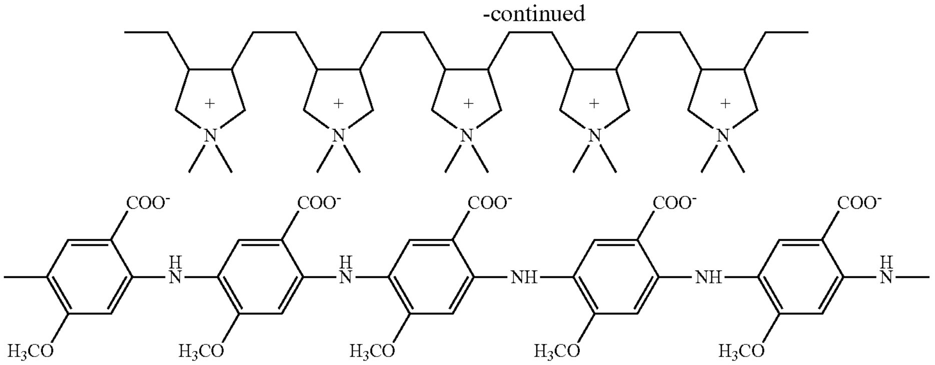
<Polymer 12>
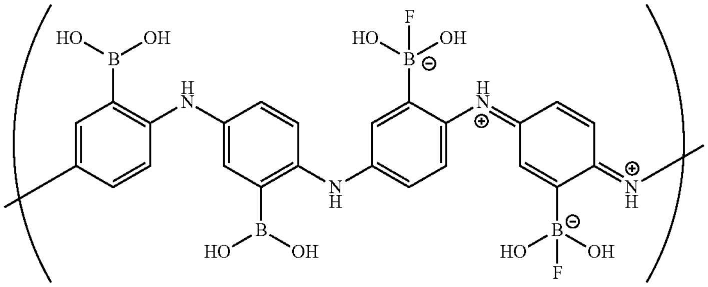
<Polymer 13>
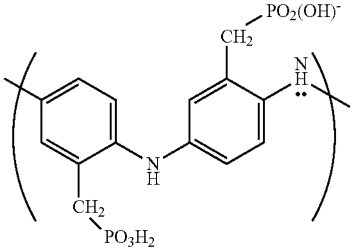
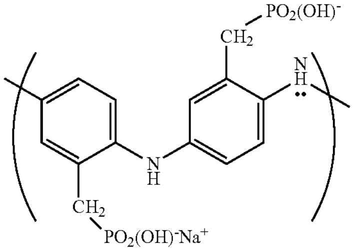
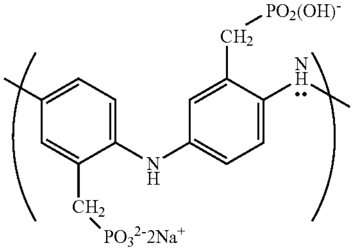
<Polymer 14> <Polymer 15> <Polymer 16>
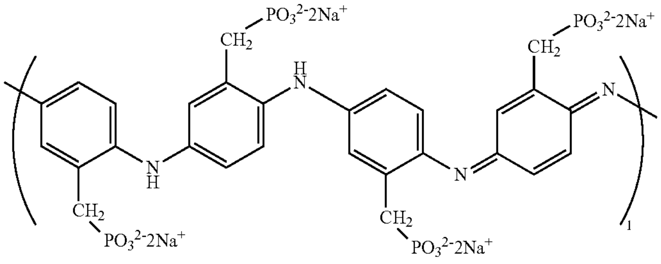
<Polymer 17>
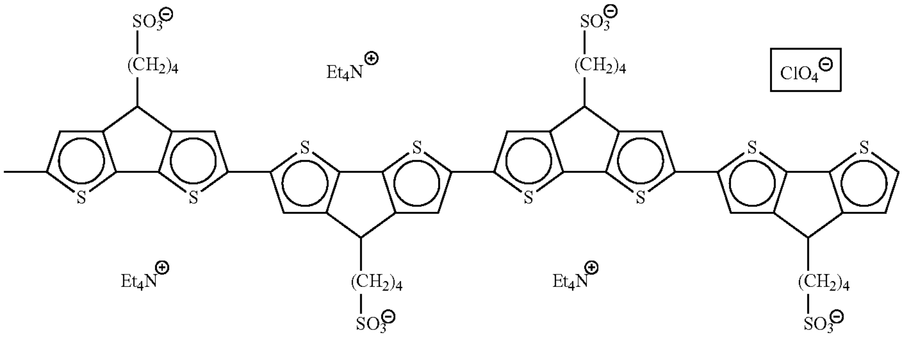
<Polymer 18>

-continued
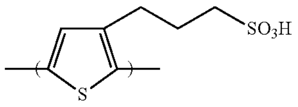
<Polymer 19>
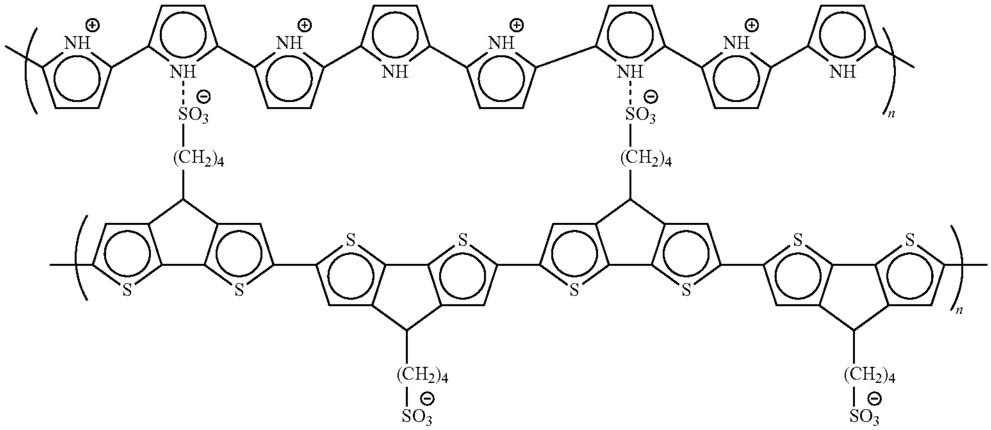
<Polymer 20>
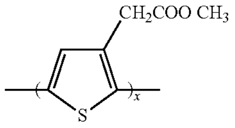
<Polymer 19>
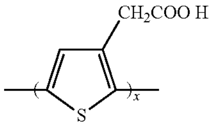
<Polymer 19>
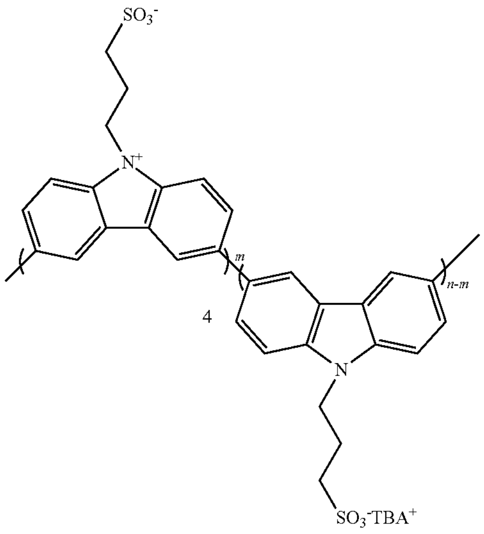
<Polymer 23>
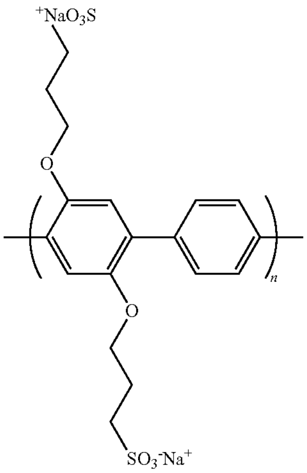
<Polymer 24>

-continued

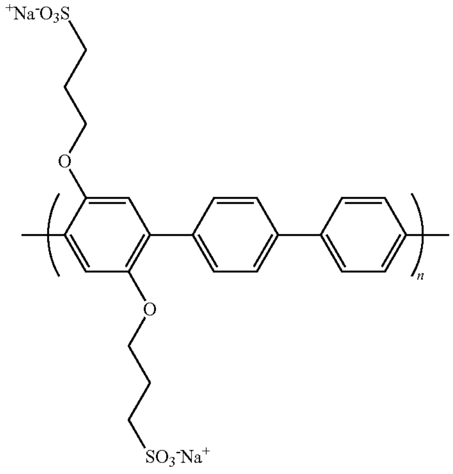

<Polymer 25>

The first fluorine-based material included in the conductive layer 13, and the second fluorine-based material included in the surface energy-tuning layer 15 may each independently be an ionomer (a polymer containing an ionic group) represented by the following Formula 1:

<Formula 1>

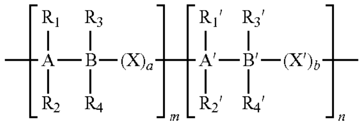

In Formula 1, $0<m\leq 10{,}000{,}000$, $0\leq n<10{,}000{,}000$, $0\leq a\leq 20$, and $0\leq b\leq 20$;

A, B, A', and B' are each independently selected from the group consisting of C, Si, Ge, Sn, and Pb;

$R_1$, $R_2$, $R_3$, $R_4$, $R_1'$, $R_2'$, $R_3'$, and $R_4'$ are each independently selected from the group consisting of hydrogen, a halogen, a nitro group, a substituted or unsubstituted amino group, a cyano group, a substituted or unsubstituted $C_1$-$C_{30}$ alkyl group, a substituted or unsubstituted $C_1$-$C_{30}$ heteroalkyl group, a substituted or unsubstituted $C_1$-$C_{30}$ alkoxy group, a substituted or unsubstituted $C_1$-$C_{30}$ heteroalkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_1$-$C_{30}$ heteroalkylester group, a substituted or unsubstituted $C_6$-$C_{30}$ arylester group, and a substituted or unsubstituted $C_2$-$C_{30}$ heteroarylester group, provided that at least one of $R_1$, $R_2$, $R_3$, and $R_4$ is an ionic group, or includes the ionic group; and X and X' are each independently selected from the group consisting of a simple bond, O, S, a substituted or unsubstituted $C_1$-$C_{30}$ alkylene group, a substituted or unsubstituted $C_1$-$C_{30}$ heteroalkylene group, a substituted or unsubstituted $C_6$-$C_{30}$ arylene group, a substituted or unsubstituted $C_6$-$C_{30}$ arylalkylene group, a substituted or unsubstituted $C_2$-$C_{30}$ heteroarylene group, a substituted or unsubstituted $C_2$-$C_{30}$ heteroarylalkylene group, a substituted or unsubstituted $C_5$-$C_{20}$ cycloalkylene group, a substituted or unsubstituted $C_5$-$C_{30}$ heterocycloalkylene group, a substituted or unsubstituted $C_6$-$C_{30}$ arylester group, and a substituted or unsubstituted $C_2$-$C_{30}$ heteroarylester group, provided that, when n is 0, at least one of $R_1$, $R_2$, $R_3$, and $R_4$ is a hydrophobic functional group containing a halogen element, or includes the hydrophobic functional group.

Such a hydrophobic functional group may, for example, include a halogenated $C_1$-$C_{30}$ alkyl group, a halogenated $C_1$-$C_{30}$ alkoxy group, a halogenated $C_1$-$C_{30}$ heteroalkyl group, a halogenated $C_1$-$C_{30}$ alkoxy group, a halogenated $C_1$-$C_{30}$ heteroalkoxy group, a halogenated $C_6$-$C_{30}$ aryl group, a halogenated $C_6$-$C_{30}$ arylalkyl group, a halogenated $C_6$-$C_{30}$ aryloxy group, a halogenated $C_2$-$C_{30}$ heteroaryl group, a halogenated $C_2$-$C_{30}$ heteroarylalkyl group, a halogenated $C_2$-$C_{30}$ heteroaryloxy group, a halogenated $C_5$-$C_{20}$ cycloalkyl group, a halogenated $C_2$-$C_{30}$ heterocycloalkyl group, a halogenated $C_1$-$C_{30}$ alkylester group, a halogenated $C_1$-$C_{30}$ heteroalkylester group, a halogenated $C_6$-$C_{30}$ arylester group, or a halogenated $C_2$-$C_{30}$ heteroarylester group, all of which contains at least one of a halogen atom and a halogen element. For example, the hydrophobic functional group may be a halogen atom. Specifically, the hydrophobic functional group may be fluorine, but the present invention is not limited thereto.

When $0<n<10{,}000{,}000$, the ionomer has a structure copolymerized with a non-ionic monomer containing no ionic groups. Thus, the content of the ionic group in the ionomer may be reduced within a proper range, resulting in a decrease in content of residues decomposed by a reaction with electrons. In this case, the content of a non-ionic comonomer may be in a range of 1 mole % to 99 mole %, for example, 1 to 50 mole %, based on a total of the contents of the monomers required to form the ionomer. When the content of the comonomer satisfies this content range, an ionomer containing a sufficient content of the ionic group may be produced.

At least one of $R_1$, $R_2$, $R_3$, and $R_4$ in Formula 1 may be an ionic group, or may include the ionic group. In this case, the ionic group consists of a pair of a negative ion and a positive ion. Here, examples of the negative ion may include $PO_3^{2-}$, $SO_3^-$, $COO^-$, $I^-$, $CHOSO_3^-$, $CH_3COO^-$, $BO_2^{2-}$, or the like, and examples of the positive ion may include metal ions such as $Na^+$, $K^+$, $Li^+$, $Mg^{+2}$, $Zn^{+2}$, and $Al^{+3}$; or organic ions such as $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, $RCHO^+$ (R is an alkyl group, that is, $CH_3(CH_2)_n$—; and n is an integer ranging from 0 to 50).

For example, the first fluorine-based material and the second fluorine-based material may each independently be an ionomer including at least one of repeating units represented by the following Formulas 2 to 13.

<Formula 2>

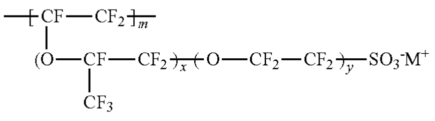

In Formula 2, m is an integer ranging from 1 to 10,000,000, x and y are each independently an integer ranging from 0 to 10, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 3>

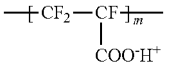

In Formula 3, m is an integer ranging from 1 to 10,000,000;

<Formula 4>

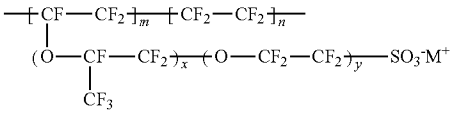

In Formula 4, m and n are $0<m\leq 10{,}000{,}000$, and $0\leq n<10{,}000{,}000$, respectively, x and y are each independently an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 5>

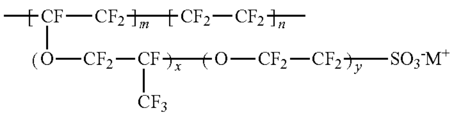

In Formula 5, m and n are $0<m\leq 10{,}000{,}000$, and $0\leq n<10{,}000{,}000$, respectively, x and y are each independently an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 6>

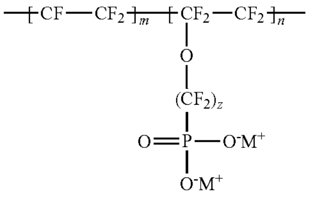

In Formula 6, m and n are $0<m\leq 10{,}000{,}000$, and $0\leq n<10{,}000{,}000$, respectively, z is an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 7>

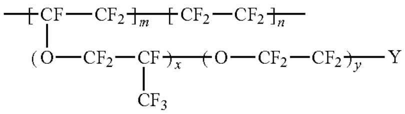

In Formula 7, m and n are $0<m\leq 10{,}000{,}000$, and $0\leq n<10{,}000{,}000$, respectively, x and y are each independently an integer ranging from 0 to 20, Y is at least one selected from the group consisting of —$COO^-M^+$, —$SO_3^-NHSO_2CF_3^+$, and —$PO_3^{2-}(M^+)_2$, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 8>

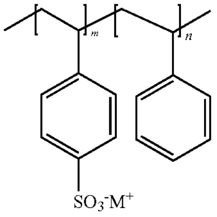

In Formula 8, m and n are $0<m\leq 10{,}000{,}000$, and $0\leq n<10{,}000{,}000$, respectively, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 9>

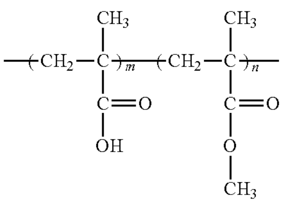

In Formula 9, m and n are 0<m≤10,000,000, and 0≤n<10,000,000, respectively;

<Formula 10>

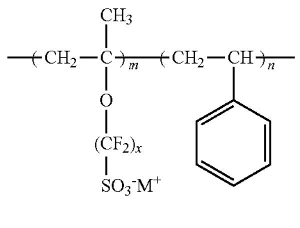

In Formula 10, m and n are 0<m≤10,000,000, and 0≤n<10,000,000, respectively, x is an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 11>

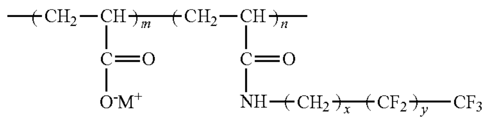

In Formula 11, m and n are 0<m≤10,000,000, and 0≤n<10,000,000, respectively, x and y are each independently an integer ranging from 0 to 20, and $M^+$ represents $Na^+$, $K^+$, $Li^+$, H+, $CH_3(CH_2)_nNH_3^+$ (n is an integer ranging from 0 to 50), $NH_4^+$, $NH_2$+, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 12>

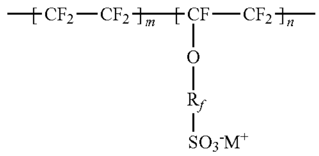

In Formula 12, m and n are 0≤m<10,000,000, and 0<n≤10,000,000, respectively, $R_f$=—$(CF_2)_z$— (z is an integer ranging from 1 to 50, provided that n is not 2), —$(CF_2CF_2O)_zCF_2CF_2$— (z is an integer ranging from 1 to 50), or —$(CF_2CF_2CF_2O)_zCF_2CF_2$— (z is an integer ranging from 1 to 50), and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 13>

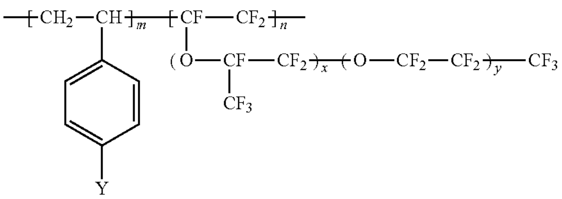

In Formula 13, m and n are 0≤m<10,000,000, and 0<n≤10,000,000, respectively, x and y are each independently an integer ranging from 0 to 20, Y is each independently at least one selected from the group consisting of —$SO_3^-M^+$, —$COO^-M^+$, —$SO_3^-NHSO_2CF_3^+$, or —$PO_3^{2-}(M^+)_2$, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50).

Also, the first fluorine-based material included in the conductive layer 13, and the second fluorine-based material included in the surface energy-tuning layer 15 may each independently be a fluorine-based polymer including a repeating unit represented by one of the following Formulas 14 to 19:

<Formulas 14>

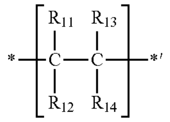

<Formulas 15>

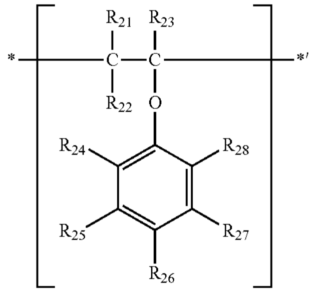

<Formulas 16>

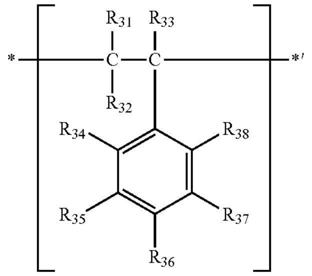

<Formulas 17>

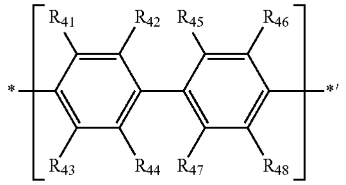

<Formulas 18>

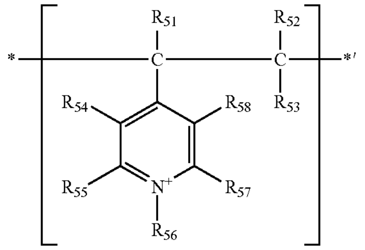

-continued

<Formulas 19>

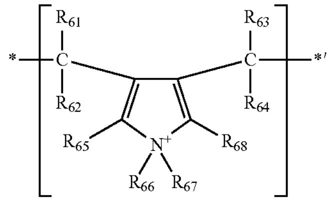

In Formulas 14 to 19, $R_{11}$ to $R_{14}$, $R_{21}$ to $R_{28}$, $R_{31}$ to $R_{38}$, $R_{41}$ to $R_{48}$, $R_{51}$ to $R_{58}$, and $R_{61}$ to $R_{68}$ are each independently selected from the group consisting of hydrogen, —F, a $C_1$-$C_{20}$ alkyl group (for example, a methyl group, an ethyl group, a propyl group, a butyl group, a pentyl group, a heptyl group, a hexyl group, and an octyl group), a $C_1$-$C_{20}$ alkoxy group (for example, a methoxy group, an ethoxy group, a propoxy group, a butoxy group, and a pentoxy group), a $C_1$-$C_{20}$ alkyl group substituted with at least one —F (for example, a methyl group, an ethyl group, a propyl group, a butyl group, a pentyl group, a heptyl group, a hexyl group, and an octyl group, all of which are substituted with at least one —F), a $C_1$-$C_{20}$ alkoxy group substituted with at least one —F (for example, a methoxy group, an ethoxy group, a propoxy group, a butoxy group, and a pentoxy group, all of which are substituted with at least one —F), $Q_1$, —O—$(CF_2CF(CF_3)$—$O)_n$—$(CF_2)_m$-$Q_2$ (where n and m are each independently an integer ranging from 0 to 20, provided that the sum of n and m is greater than or equal to 1), and —$(OCF_2CF_2)_x$-$Q_3$ (where x is an integer ranging from 1 to 20), provided that:

i) at least one of $R_{11}$ to $R_{14}$ in Formula 14, ii) at least one of $R_{21}$ to $R_{28}$ in Formula 15, iii) at least one of $R_{31}$ to $R_{38}$ in Formula 16, iv) at least one of $R_{41}$ to $R_{48}$ in Formula 17, v) at least one of $R_{51}$ to $R_{58}$ in Formula 18, and v) at least one of $R_{61}$ to $R_{68}$ in Formula 19 are selected from the group consisting of —F, a $C_1$-$C_{20}$ alkyl group substituted with at least one —F, a $C_1$-$C_{20}$ alkoxy group substituted with at least one —F, —O—$(CF_2CF(CF_3)$—$O)_n$—$(CF_2)_m$-$Q_2$, and —$(OCF_2CF_2)_x$-$Q_3$.

That is, the fluorine-based polymer including the repeating unit represented by one of the above Formulas 14 to 19 absolutely includes —F, or a substituent containing —F (for example, a $C_1$-$C_{20}$ alkyl group substituted with at least one —F, etc.) present at at least one of the main chain and the side chain thereof.

$Q_1$ to $Q_3$ are each independently an ionic group.

The ionic group may include an anionic group, and a cationic group.

In this case, the anionic group may be selected from the group consisting of $PO_3^{2-}$, $SO_3^-$, $COO^-$, $I^-$, $CH_3COO^-$, and $BO_2^{2-}$.

Meanwhile, the cationic group may include at least one type of a metal ion, and an organic ion. Here, the metal ion may be selected from the group consisting of $Na^+$, $K^+$, $Li^+$, $Mg^{+2}$, $Zn^{+2}$, and $Al^{+3}$, and the organic ion may be selected from the group consisting of $H^+$, $CH_3(CH_2)_{n1}NH_3^+$ (where n1 is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (where R is $CH_3(CH_2)_{n2}$—, and n2 is an integer ranging from 0 to 50).

For example, $Q_1$ to $Q_3$ may each independently be —$SO_3H$, —$SO_3Na$, —$SO_3Li$, —$PO_3H_2$, or —$PO_3Na_2$, but the present invention is not limited thereto.

The fluorine-based polymer may include at least one of repeating units represented by Formulas 14 to 19. For example, there are various possible modified embodiments in which the fluorine-based polymer may be a homopolymer including a repeating unit represented by the Formula 14, or a copolymer including a repeating unit represented by Formula 14 and a repeating unit represented by Formula 15.

For example, the fluorine-based polymer includes the repeating unit represented by Formula 14. In Formula 14, $R_{11}$ to $R_{13}$ may each independently be hydrogen, or —F, $R_{14}$ may be —O—$(CF_2CF(CF_3)$—$O)_n$—$(CF_2)_m$—$SO_3H$, or —O—$(CF_2CF(CF_3)$—$O)_n$—$(CF_2)_m$—$PO_3H_2$.

By way of another example, the fluorine-based polymer includes the repeating unit represented by Formula 15. In Formula 15, $R_{21}$ to $R_{23}$ may each independently be hydrogen, or —F, and at least one of $R_{24}$ to $R_{28}$ may be selected from the group consisting of —F, a $C_1$-$C_{20}$ alkyl group substituted with at least one —F, a $C_1$-$C_{20}$ alkoxy group substituted with at least one —F, —O—$(CF_2CF(CF_3)$—$O)_n$—$(CF_2)_m$-$Q_2$, and —$(OCF_2CF_2)_x$-$Q_3$.

By way of still another example, the fluorine-based polymer includes the repeating unit represented by Formula 15. In Formula 15, at least one of $R_{21}$ to $R_{23}$ may be —F, and at least one of $R_{24}$ to $R_{28}$ may be $Q_1$. For a definition of $Q_1$, see the definition as defined above.

By way of still another example, the fluorine-based polymer includes the repeating unit represented by Formula 18. In Formula 18, $R_{51}$ to $R_{53}$ may each independently be hydrogen, or —F, and at least one of $R_{54}$ to $R_{58}$ may be selected from the group consisting of —F, a $C_1$-$C_{20}$ alkyl group substituted with at least one —F, a $C_1$-$C_{20}$ alkoxy group substituted with at least one —F, —O—$(CF_2CF(CF_3)$—$O)_n$—$(CF_2)_m$-$Q_2$, and —$(OCF_2CF_2)_x$-$Q_3$.

By way of yet another example, the fluorine-based polymer includes the repeating unit represented by Formula 19. In Formula 19, $R_{61}$ to $R_{64}$ may each independently be hydrogen, or —F, and at least one of $R_{65}$ to $R_{68}$ may be selected from the group consisting of —F, a $C_1$-$C_{20}$ alkyl group substituted with at least one —F, a $C_1$-$C_{20}$ alkoxy group substituted with at least one —F, —O—$(CF_2CF(CF_3)$—$O)_n$—$(CF_2)_m$-$Q_2$, and —$(OCF_2CF_2)_x$-$Q_3$.

According to one embodiment, the conductive thin film may include a fluorine-based polymer including a repeating unit represented by the following Formula 14A, but the present invention is not limited thereto:

<Formula 14A>

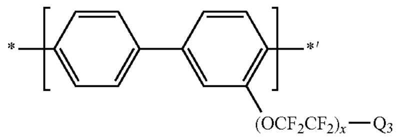

For descriptions of x and $Q_3$ in Formula 14A, see the descriptions as described above in this specification.

Meanwhile, the first fluorine-based material included in the conductive layer 13, and the second fluorine-based material included in the surface energy-tuning layer 15 may each independently be a fluorinated oligomer represented by the following Formula 20.

$$X\text{-}M^f_n\text{-}M^h_m\text{-}M^a_r\text{-}G$$ <Formula 20>

In Formula 20, X is an end group;

$M^f$ represents a unit derived from a fluorinated monomer obtained from a condensation reaction of a perfluoropolyether alcohol, polyisocyanate, and an isocyanate-reactive non-fluorinated monomer or a fluorinated $C_1$-$C_{10}$ alkylene group;

$M^h$ represents a unit derived from a non-fluorinated monomer;

$M^a$ represents a unit containing a silyl group represented by —$Si(Y_4)(Y_5)(Y_6)$;

$Y_4$, $Y_5$, and $Y_6$ each independently represent a substituted or unsubstituted $C_1$-$C_{20}$ alkyl group, a substituted or unsubstituted $C_6$-$C_{30}$ aryl group, or a hydrolyzable substituent, provided that at least one of $Y_4$, $Y_5$, and $Y_6$ is the hydrolyzable substituent;

G is a monovalent organic group containing a residue of a chain transfer agent;

n is an integer ranging from 1 to 100;

m is an integer ranging from 0 to 100; and r is an integer ranging from 0 to 100;

provided that the sum of n, m, and r is at least 2.

For example, in Formula 20, X may be a halogen atom, $M^f$ may be a fluorinated $C_1$-$C_{10}$ alkylene group, $M^h$ may be a $C_2$-$C_{10}$ alkylene group, $Y_4$, $Y_5$, and $Y_6$ may each independently be a halogen atom (Br, Cl, F, etc.), and p may be 0. For example, the fluorinated silane-based material represented by Formula 20 may be $CF_3CH_2CH_2SiCl_3$, but the present invention is not limited thereto.

In this specification, specific examples of the unsubstituted alkyl group may include a linear or branched alkyl group, for example, methyl, ethyl, propyl, isobutyl, sec-butyl, tert-butyl, pentyl, iso-amyl, hexyl, etc., and one or more hydrogen atoms included in the alkyl group may be substituted with at least one of a halogen atom, a hydroxyl group, a nitro group, a cyano group, a substituted or unsubstituted amino group (—$NH_2$, —NH(R), —N(R')(R") where R' and R" are each independently an alkyl group having 1 to 10 carbon atoms), an amidino group, a hydrazine or hydrazone group, a carboxyl group, a sulfonate group, a phosphate group, a $C_1$-$C_{20}$ alkyl group, a halogenated $C_1$-$C_{20}$ alkyl group, a $C_1$-$C_{20}$ akenyl group, a $C_1$-$C_{20}$ akynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, and a $C_6$-$C_{20}$ heteroarylalkyl group.

In this specification, the heteroalkyl group means that one or more carbon atoms, preferably 1 to 5 carbon atoms in the main chain of the alkyl group are substituted with heteroatoms such as oxygen atoms, sulfur atoms, nitrogen atoms, phosphorus atoms, etc.

In this specification, the aryl group refers to a carbocyclic aromatic system containing one or more aromatic rings. In this case, the rings may be attached or fused together using a pendant method. Specific example of the aryl group may include aromatic groups such as phenyl, naphthyl, tetrahydronaphthyl, etc. In this case, one or more hydrogen atoms in the aryl group may be substituted with the same substituents as in the alkyl group.

In this specification, the heteroaryl group refers to a cyclic aromatic system containing 1, 2 or 3 heteroatoms selected from N, O, P, and S, and other carbon rings having 5 to 30 ring atoms. Here, the rings may be attached or fused together using a pendant method. In this case, one or more hydrogen atoms in the heteroaryl group may be substituted with the same substituents as in the alkyl group.

In this specification, the alkoxy group refers to a radical —O-alkyl. In this case, the alkyl is as defined above. Specific examples of the alkoxy group may include methoxy, ethoxy, propoxy, isobutyloxy, sec-butyloxy, pentyloxy, iso-amyloxy, hexyloxy, etc. In this case, one or more hydrogen atoms in the alkoxy group may be substituted with the same substituents as in the alkyl group.

As the substituent used in the present invention, the heteroalkoxy group has substantially the same meaning as the alkoxy, except that one or more heteroatoms, for example, oxygen, sulfur or nitrogen, may be present in the alkyl chain, and, for example, includes $CH_3CH_2OCH_2CH_2O$—, $C_4H_9OCH_2CH_2OCH_2CH_2O$—, and $CH_3O(CH_2CH_2O)_nH$.

In this specification, the arylalkyl group means that some of hydrogen atoms in the aryl group as defined above are substituted with radicals such as lower alkyls, for example, methyl, ethyl, propyl, etc. For example, the arylalkyl group may include benzyl, phenylethyl, etc. In this case, one or more hydrogen atoms in the arylalkyl group may be substituted with the same substituents as in the alkyl group.

In this specification, the heteroarylalkyl group means that some of hydrogen atoms in the heteroaryl group are substituted with lower alkyl groups. Here, a definition of the heteroaryl in the heteroarylalkyl group is as described above. In this case, one or more hydrogen atoms in the heteroarylalkyl group may be substituted with the same substituents as in the alkyl group.

In this specification, the aryloxy group refers to a radical —O-aryl. In this case, the alkyl is as defined above. Specific examples of the aryloxy group may include phenoxy, naphthoxy, anthracenyloxy, phenanthrenyloxy, fluorenyloxy, indenyloxy, etc. In this case, one or more hydrogen atoms in the aryloxy group may be substituted with the same substituents as in the alkyl group.

In this specification, the heteroaryloxy group refers to a radical —O-heteroaryl. In this case, the heteroaryl is as defined above.

In this specification, specific examples of the heteroaryloxy group may include a benzyloxy group, a phenylethyloxy group, etc. In this case, one or more hydrogen atoms in the heteroaryloxy group may be substituted with the same substituents as in the alkyl group.

In this specification, the cycloalkyl group refers to a monovalent monocyclic system having 5 to 30 carbon atoms. In this case, one or more hydrogen atoms in the cycloalkyl group may be substituted with the same substituents as in the alkyl group.

In this specification, the heterocycloalkyl group refers to a monovalent monocyclic system containing 1, 2 or 3 heteroatoms selected from N, O, P, and S, and other carbon rings having 5 to 30 ring atoms. In this case, one or more hydrogen atoms in the cycloalkyl group may be substituted with the same substituents as in the alkyl group.

In this specification, the alkylester group refers to a functional group in which an ester group is bound to an alkyl group. In this case, the alkyl group is as defined above.

In this specification, the heteroalkylester group refers to a functional group in which an ester group is bound to a heteroalkyl group. In this case, the heteroalkyl group is as defined above.

In this specification, the arylester group refers to a functional group in which an ester group is bound to an aryl group. In this case, the aryl group is as defined above.

In this specification, the heteroarylester group refers to a functional group in which an ester group is bound to a heteroaryl group. In this case, the heteroaryl group is as defined above.

The amino group used in the present invention refers to —$NH_2$, —NH(R), or —N(R')(R"). Here, R' and R" are each independently an alkyl group having 1 to 10 carbon atoms.

In this specification, the halogen is fluorine, chlorine, bromine, iodine, or astatine. Among these, fluorine is particularly desirable.

The surface energy-tuning layer 15 has a thickness of 1 nm to 10 nm, for example, it may be 1 nm to 5 nm. When the thickness of the surface energy-tuning layer 15 satisfies this thickness range, the work function of the conductive thin film may be easily adjusted.

The first fluorine-based material included in the conductive layer 13, and the second fluorine-based material included in the surface energy-tuning layer 15 may be the same or different from each other.

A method for producing the conductive thin film 10 may include providing a first mixture, which includes the conductive polymer, the first fluorine-based material, and a first solvent, onto a substrate and removing at least a portion of the first solvent to form a conductive layer 13; and providing a second mixture, which includes the second fluorine-based material and a second solvent, onto the conductive layer and removing at least a portion of the second solvent to form a surface energy-tuning layer 15.

The substrate is a support on which the conductive thin film 10 will be formed. For example, the substrate may include glass, sapphire, silicon, silicon oxide, metal foil (for example, copper foil, and aluminum foil), a steel substrate (for example, stainless steel, etc.), a metal oxide, a polymer substrate, and a combination of two or more types thereof. Examples of the metal oxide may include aluminum oxide, molybdenum oxide, indium oxide, tin oxide, and indium tin oxide, and examples of the polymer substrate may include Kapton foil, polyethersulfone (PES), polyacrylate (PAR), polyether imide (PEI), polyethylene napthalate (PEN), polyethylene terepthalate (PET), polyphenylene sulfide (PPS), a polyallylate, a polyimide, a polycarbonate (PC), triacetyl cellulose (TAC), cellulose acetate propinonate (CAP), etc., but the present invention is not limited thereto. Also, the substrate may be optionally a TFT substrate, or an insulating layer, and may be readily chosen according to the structure of an electronic element to be produced using the conductive thin film 10.

The first solvent is miscible with the conductive polymer and the first fluorine-based material, and may be a solvent which may be easily removed by a process such as heat treatment, etc. For example, the first solvent may include at least one selected from the group consisting of water, alcohol, dimethylformamide (DMF), dimethyl sulfoxide (DMSO), acetone, acetonitrile, toluene, dichlorobenzene, tetrahydrofuran, dichloroethane, trichloroethane, chloroform, and dichloromethane, but the present invention is not limited thereto.

The first mixture may be provided onto the substrate using known methods such as casting, a Langmuir-Blodgett (LB) method, spin coating, ink-jet printing, nozzle printing, slot-die coating, spray coating, screen printing, doctor blade coating, gravure printing, and offset printing.

Next, the first mixture provided onto the substrate may be heat-treated to remove a portion of the first solvent so as to form a conductive layer 13. The conditions for the heat treatment process may vary according to the types and contents of the conductive polymer and the first fluorine-based material used. For example, the heat treatment process may be performed at 25° C. to 300° C. for 1 minute to 24 hours.

Subsequently, a second mixture including a second fluorine-based material and a second solvent may be provided onto the conductive layer 13 using known methods such as casting, a Langmuir-Blodgett (LB) method, spin coating, ink-jet printing, nozzle printing, spray coating, slot-die coating, screen printing, doctor blade coating, gravure printing, and offset printing.

The second solvent may be selected from solvents which are miscible with the fluorine-based material but are not substantially reactive with the conductive polymer. In this case, the second solvent may be easily chosen according to the selected conductive polymer and second fluorine-based material. For example, the second solvent may include at least one selected from the group consisting of water, alcohol, dimethylformamide (DMF), dimethyl sulfoxide (DMSO), acetone, acetonitrile, toluene, dichlorobenzene, tetrahydrofuran, dichloroethane, trichloroethane, chloroform, dichloromethane, and hydrofluoroether (HFE), but the present invention is not limited thereto.

Then, the second mixture provided onto the conductive layer 13 may be heat-treated to remove a portion of the second solvent so as to form the surface energy-tuning layer 15. The conditions for the heat treatment process may vary according to the type and content of the second fluorine-based material used, but may be chosen within a range of the heat treatment conditions used to form the conductive layer 13.

Figure 2:
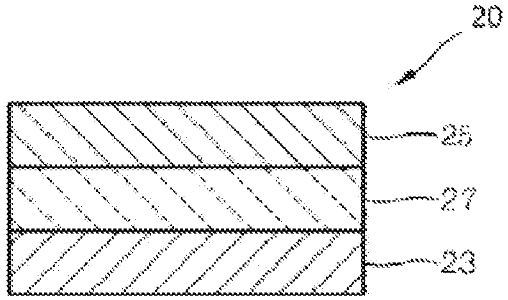
FIG. 2 is a schematic cross-sectional view of a conductive thin film according to another embodiment of the present invention.

FIG. 2 is a schematic cross-sectional view of a conductive thin film 20 according to another embodiment of the present invention. The conductive thin film 20 sequentially includes a conductive layer 23, an interlayer 27, and a surface energy-tuning layer 25. For descriptions of the conductive layer 23 and the surface energy-tuning layer 25, see the description of the conductive layer 13 and the surface energy-tuning layer 15 shown in FIG. 1, respectively.

The interlayer 27 includes a conductive polymer and a first fluorine-based material included in the conductive layer 23, and a second fluorine-based material included in the surface energy-tuning layer 25. In this case, the first fluorine-based material and the second fluorine-based material are different from each other. The conductive polymer, the first fluorine-based material, and the second fluorine-based material included in the interlayer 27 may be uniformly or non-uniformly mixed with each other. For example, there are various possible modified embodiments in which the concentrations of the first fluorine-based material and the second fluorine-based material included in the interlayer 27 may form a gradient decreasing in a direction spanning from the surface energy-tuning layer 25 to the conductive layer 23.

A method for producing the conductive thin film 20 may include providing a first mixture, which includes a conductive polymer, a first fluorine-based material, and a first solvent, onto a substrate and removing at least a portion of the first solvent to form a conductive layer 23; and providing a second mixture, which includes a second fluorine-based material and a second solvent, onto the conductive layer 23 to form a first layer including the conductive polymer, the first fluorine-based material, the second fluorine-based material, and the second solvent, and a second layer including the second fluorine-based material and the second solvent, and removing at least a portion of the second solvent to form a surface energy-tuning layer 25 and an interlayer 27 including the conductive polymer, the first fluorine-based material, and the second fluorine-based material at the same time.

For the formation of the conductive layer 23, see the formation of the conductive layer 13 as shown in FIG. 1.

When a solvent miscible with the conductive polymer and the first fluorine-based material is selected as the second solvent of the second mixture to be provided onto the conductive layer 23, a surface of the conductive layer 23 may react with (for example, may be partially dissolved in) the second solvent as the second mixture is provided onto the conductive layer 23. As a result, the first layer including the conductive polymer, the first fluorine-based material, the second fluorine-based material, and the second solvent, and the second layer including the second fluorine-based material and the second solvent may be formed on the conductive layer 23. Thereafter, the interlayer 27 including the conductive polymer, the first fluorine-based material, and the second fluorine-based material, and the surface energy-tuning layer 25 including the second fluorine-based material may be formed at the same time by performing a process for removing at least a portion of the second solvent of the first layer and second layer, for example, a heat treatment process (for the heat treatment conditions, see the above-described above conditions for the heat treatment conditions).

The conductivity of the conductive thin film 10 or 20 may depend on a material of the conductive layer, and thus the conductive thin film 10 or 20 may have a conductivity of $1\times10^{-7}$ S/cm to $1\times10^{6}$ S/cm, based on its thickness of 100 nm. For example, when the conductive thin film 10 or 20 is used as the anode, the conductive thin film 10 or 20 may have a conductivity of at least 0.1 S/cm to $1\times10^{6}$ S/cm, based on its thickness of 100 nm. Also, when the conductive thin film 10 or 20 is used as a hole injection or extraction buffer layer formed on the anode, the conductive thin film 10 or 20 may have a conductivity of $1\times10^{-7}$ S/cm to $1\times10^{-2}$ S/cm.

The surface energy-tuning layer 15 or 25 which has substantially no conductive polymer is present on a surface of the conductive thin film 10 or 20 as described above. Therefore, the surface energy and the work function of the conductive thin film 10 or 20 may be determined by the surface energy-tuning layer, regardless of the conductive layer formed therebelow, while maintaining the high conductivity of the conductive thin film 10 or 20. Thus, the work function conditions required for various electronic elements may be effectively satisfied.

Therefore, the conductive thin film 10 or 20 as described above may be effectively used in various electronic elements. The electronic elements may include an organic light-emitting device, an organic solar cell, an organic transistor, an organic memory device, an organic photodetector, or an organic CMOS sensor. The electronic elements may be included in various electronic devices such as a display device, a light lamp, a semiconductor chip, etc.

For example, the electronic element may be an organic light-emitting device, or an organic solar cell.

Figure 3:
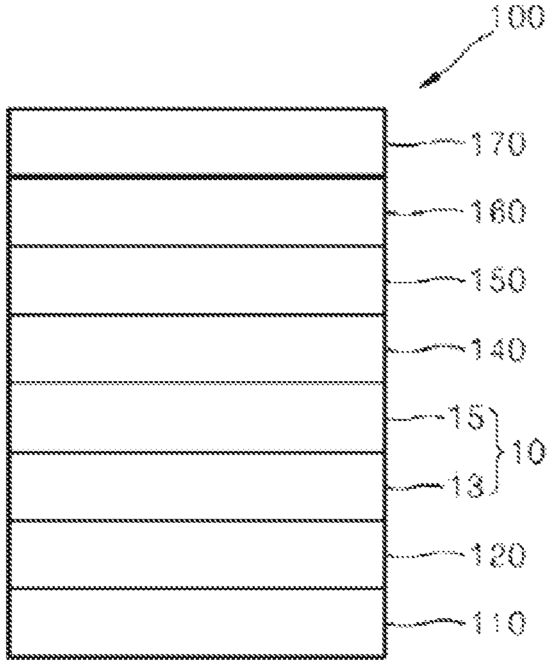
FIG. 3 is a schematic cross-sectional view of an organic light-emitting device that is an electronic element according to still another embodiment of the present invention.

FIG. 3 is a diagram showing a schematic cross-sectional view of an organic light-emitting device 100 that is an electronic element according to one embodiment of the present invention.

The organic light-emitting device 100 includes a substrate 110, an anode 120, a conductive thin film 10, a light emitting layer 140, an electron transport layer 150, an electron injection layer 160, and a cathode 170. The organic light-emitting device 100 may show device performance even when the electron transport layer is selectively removed. Also, a hole transport layer may be selectively introduced between the conductive thin film 10 and the light emitting layer 140 (not shown). The conductive thin film 10 includes a conductive layer 13 and a surface energy-tuning layer 15, and is used as hole injection buffer layer formed on the anode. That is, the conductive layer 13 of the conductive thin film 10 is disposed at a side of the anode 120, and the surface energy-tuning layer 15 is disposed at a side of the hole transport layer (not shown) or the light emitting layer 140. As described above, the conductive layer 13 includes the conductive polymer and a first fluorine-based material, and the surface energy-tuning layer 15 includes a second fluorine-based material, but does not include the conductive polymer included in the conductive layer 13. Here, the first fluorine-based material and the second fluorine-based material may be the same or different from each other. When a voltage is applied between the anode 120 and the cathode 170 of the organic light-emitting device 100, holes injected from the anode 120 move to the light emitting layer 140 via the conductive thin film 10, and electrons injected from the cathode 170 move to the light emitting layer 140 via the electron injection layer 160 and the electron transport layer 150. Carriers such as the holes and the electrons are recombined in the light emitting layer 140 to generate excitons. In this case, light is emitted as the excitons radiatively decays from an excited state to a ground state. When the organic light-emitting device 100 includes no hole transport layer, the conductive thin film 10 in the organic light-emitting device 100 may serve as a hole injection layer, a hole transport layer, or a functional layer having both of hole injection and transport functions.

A substrate used in a conventional semiconductor process may be used as the substrate 110. For example, the substrate 110 may include silicon, silicon oxide, metal foil (for example, copper foil, aluminum foil, stainless steel, etc.), a metal oxide, a polymer substrate, and a combination of two or more types thereof. The metal foil may be made of a material which has a high melting point but does not serve as a catalyst capable of forming graphene. Examples of the metal oxide may include aluminum oxide, molybdenum oxide, indium tin oxide, etc., and examples of the polymer substrate may include Kapton foil, polyethersulfone (PES), polyacrylate (PAR), polyether imide (PEI), polyethylene napthalate (PEN), polyethylene terepthalate (PET), polyphenylene sulfide (PPS), a polyallylate, a polyimide, a polycarbonate (PC), triacetyl cellulose (TAC), cellulose acetate propinonate (CAP), etc., but the present invention is not limited thereto.

For example, the substrate 110 may be the polymer substrate as described above, but the present invention is not limited thereto.

The anode 120 may be formed by providing an anode-forming material onto the substrate 110 using a deposition method or a sputtering method. The anode 120 may be selected from materials having a relatively high work function to promote hole injection. The anode 120 may be a reflective electrode or a transmissive electrode. Materials which are transparent and have excellent conductivity, for example, indium tin oxide (ITO), indium zinc oxide (IZO), tin oxide ($SnO_2$), zinc oxide (ZnO), a metal oxide/metal/metal oxide multilayer, a metal grid, graphene, reduced graphene oxide, and a carbon nanotube, may be used as the anode-forming material. Also, when magnesium (Mg), aluminum (Al), Ag, Ag/ITO, Ag/IZO, aluminum-lithium (Al—Li), calcium (Ca), magnesium-indium (Mg—In), magnesium-silver (Mg—Ag), and the like are used, the anode 120 may also be formed as a reflective electrode. The anode 120 may include two different materials. For example, there are various possible modified embodiments in which the anode 120 may be formed as a bilayer structure including two different materials.

The surface energy-tuning layer 15, which includes the second fluorine-based material but does not include the conductive polymer, is arranged below the light emitting layer 140. Here, because the absolute value of an ionization potential level of the surface energy-tuning layer 15 is higher than the absolute value of an ionization potential (or highest occupied molecular orbital (HOMO) energy) level of the light emitting layer 140, the transport of holes from the surface energy-tuning layer 15 to the light emitting layer 140 may be smoothly achieved. In addition, because high conductivity of the conductive thin film 10 is maintained by the conductive layer 13 (including the conductive polymer and the first fluorine-based material) disposed at a side of the anode 120, the injection of holes from the anode 120 to the conductive layer 13 may be smoothly achieved, thereby improving the efficiency of injection and transport of holes from the anode 120 to the light emitting layer 140. As a result, since the exciton generation efficiency at the light emitting layer 140 may be enhanced, the organic light-emitting device 100 may have characteristics such as high efficiency, low driving voltage, long lifetime, etc.

Any of known materials may be used as a light emitting material in the light emitting layer 140. The light emitting layer 140 may be made of a single light emitting material, and may also include a host, and a dopant.

The light emitting layer 140 may be made of a single light emitting material, and may also include a host, and a dopant.

Examples of the host that may be used herein may include $Alq_3$, 4,4'-N,N'-dicarbazole-biphenyl (CBP), 9,10-di(naphthalen-2-yl)anthracene (ADN), TCTA, TAPC, 1,3,5-tris(N-phenylbenzimidazol-2-yl)benzene (TPBI), 3-tert-butyl-9,10-di(naphth-2-yl)anthracene (TBADN), E3 (see the following Formulas), $BeBq_2$ (see the following Formulas), or a mixture thereof, but the present invention is not limited thereto.

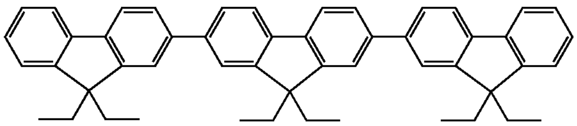

E3

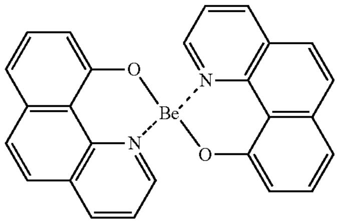

$BeBq_2$

Also, the host may include at least one of an ambipolar transport material, a hole transporting material, and an electron transporting material.

The ambipolar transport material may be optionally selected from known materials having both hole transport capability and electron transport capability. For example, examples of the ambipolar transport material may include ter(9,9-diarylfluorene) derivatives (for example, 2,7-bis[9,9-di(4-methylphenyl)-fluoren-2-yl]-9,9-di(4-methylphenyl) fluorine (TDAF), 2,7-bis(9,9-spirobifluoren-2-yl)-9,9-spirobifluorene (BDAF), 9,10-di(naphth-2-yl)anthracene (ADN), 2-tert-butyl-9,10-bis-(β-naphthyl)-anthracene (TBADN), 2,6-di(t-butyl)-9,10-di(2-naphthyl)anthracene (2TBADN), 2,6-di(tert-butyl)-9,10-di-[6-(tert-butyl)(2-naphthyl)]anthracene (3TBADN), 2-methyl-9,10-bis(naphthalen-2-yl)anthracene (MADN), terfluorene (E3), etc.), but the present invention is not limited thereto.

The electron transporting material may be a material in which electron mobility is higher than hole mobility in the same electric field. For example, the electron transporting material may be selected from the materials for the electron transport layer and/or the electron injection layer of the organic light-emitting device. Examples of the electron transporting material may include tris(8-hydroxyquinoline) aluminum ($Alq_3$), 2,2',2"-(benzene-1,3,5-triyl)-tris(1-phenyl-1H-benzimidazole) (TPBI), 2,9-dimethyl-4,7-diphenyl-1,10-phenanthroline (BCP), 4,7-diphenyl-1,10-phenanthroline (Bphen), bis(2-methyl-8-quinolinolate)-4-(phenylphenolato)aluminum (Balq), 1,3-bis[2-(2,2'-bipyridin-6-yl)-1,3,4-oxadiazo-5-yl] benzene (Bpy-OXD), 6,6'-bis[5-(biphenyl-4-yl)-1,3,4-oxadiazo-2-yl]-2,2'-bipyridyl (BP-OXD-Bpy), 3-(4-biphenyl)-4-(phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthroline (NBphen), tris(2,4,6-trimethyl-3-(pyridin-3-yl)phenyl)borane (3TPYMB), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl] benzene (TmPyPB), 1,3-bis[3,5-di(pyridin-3-yl)phenyl] benzene (BmPyPhB), bis(10-hydroxybenzo[h]quinolinato)beryllium ($Bebq_2$), diphenylbis(4-(pyridin-3-yl)phenyl)silane (DPPS), and 1,3,5-tri(p-pyrid-3-yl-phenyl)benzene (TpPyPB), but the present invention is not limited thereto.

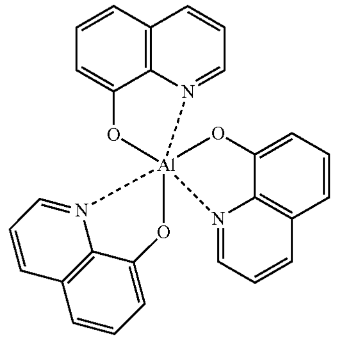

<$Alq_3$>

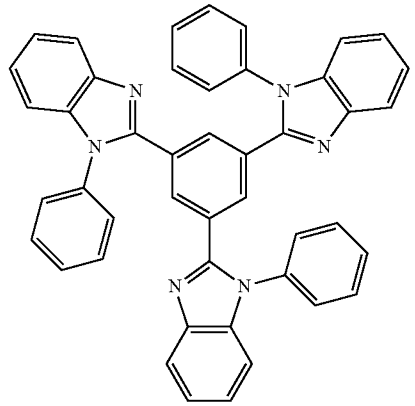

<TPBI>

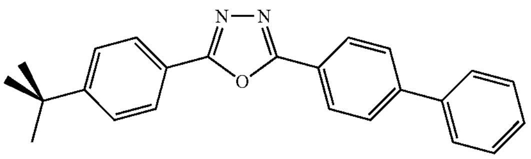

<PBD>

-continued
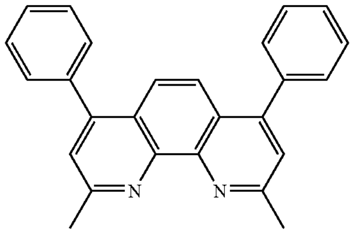
<BCP>
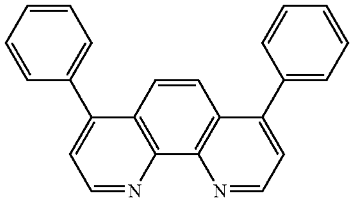
<Bphen>
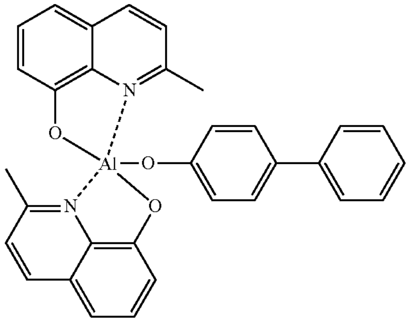
<Balq>
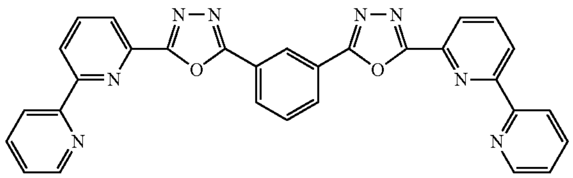
<Bpy-OXD>
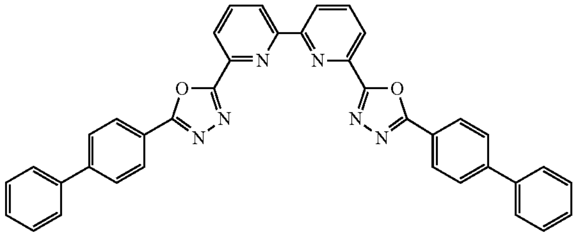
<BP-OXD-Bpy>
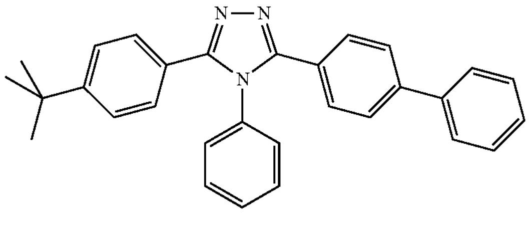
<TAZ>
-continued
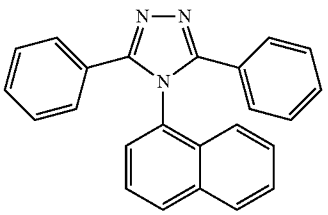
<NTAZ>
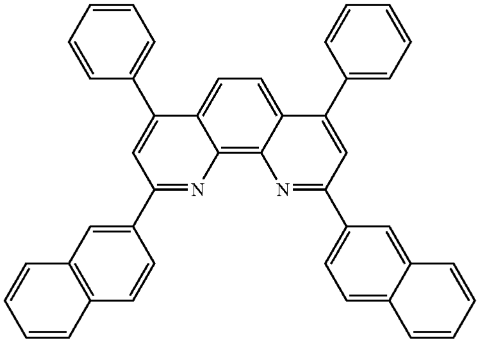
<NBphen>
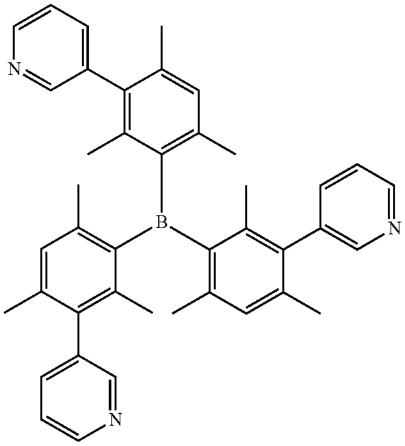
<3TPYMB>
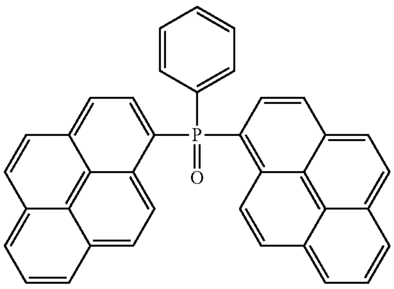
<POPy2>

-continued
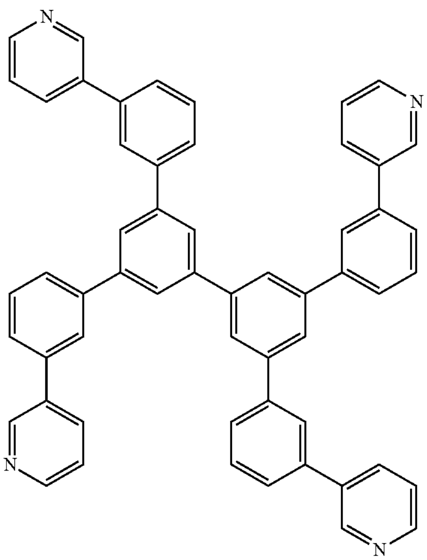
<BP4mPy>
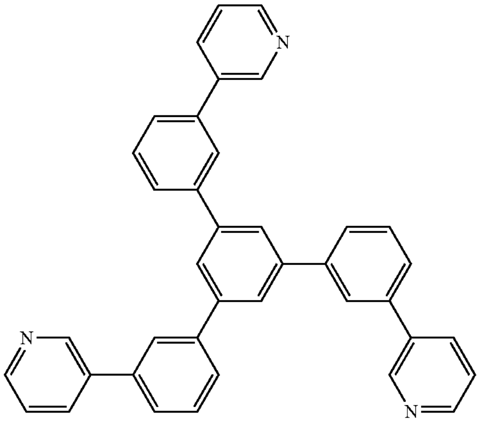
<TmPyPB>
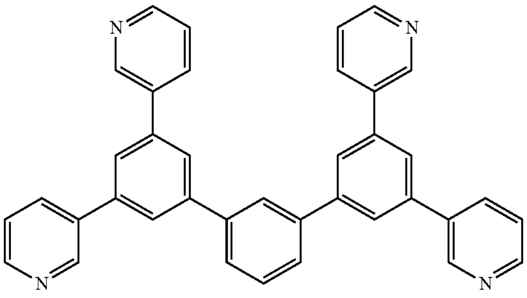
<BmPyPhB>
-continued
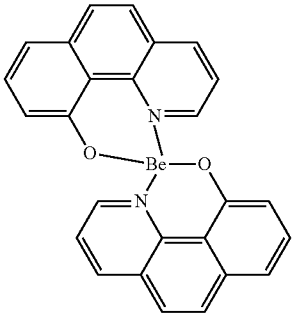
<Bepq2>
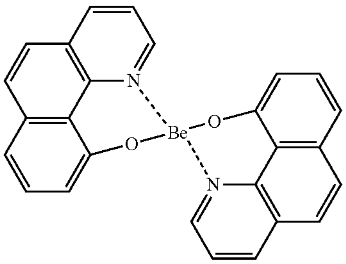
<Bebq2>
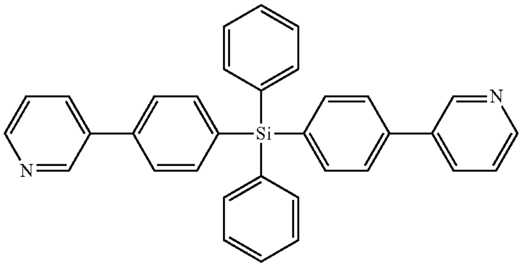
<DPPS>
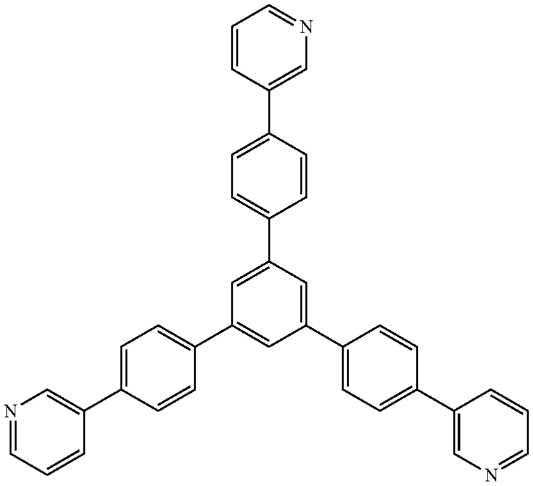
<TpPyPB>
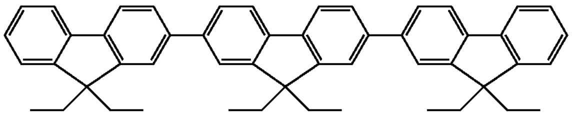
E3

The host of the light emitting layer 140 may further include a hole transporting material in addition to the ambipolar transport material and the electron transporting material as described above.

The hole transporting material may be a material in which hole mobility is higher than electron mobility in the same electric field. For example, the hole transporting material may be either the hole injection layer or the hole transport layer material of the organic light-emitting device. For example, examples of the hole transporting material may include 1,3-bis(carbazol-9-yl)benzene (MCP), 1,3,5-tris (carbazol-9-yl)benzene (TCP), 4,4',4"-tris(carbazol-9-yl)triphenylamine (TcTa), 4,4'-bis(carbazol-9-yl)biphenyl (CBP), N,N'-bis(naphthalen-1-yl)-N,N'-bis(phenyl)benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), di-[4,-(N,N-ditolyl-amino)-phenyl]cyclohexane (TAPC), N,N,N',N"-tetra-naphthalen-2-yl-benzidine (β-TNB), and N4,N4,N4',N4'-tetra(biphenyl-4-yl)biphenyl-4,4'-diamine (TPD15), but the present invention is not limited thereto.

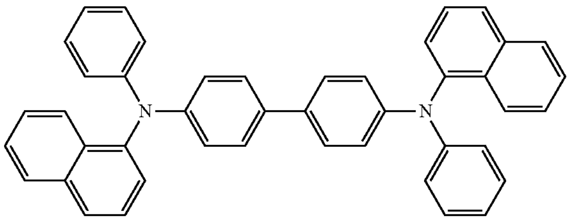

<NPB>

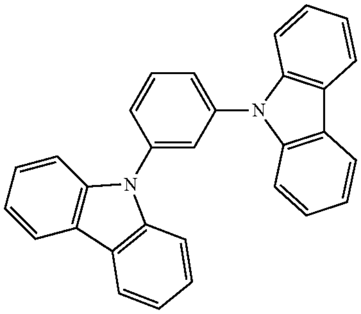

<MCP>

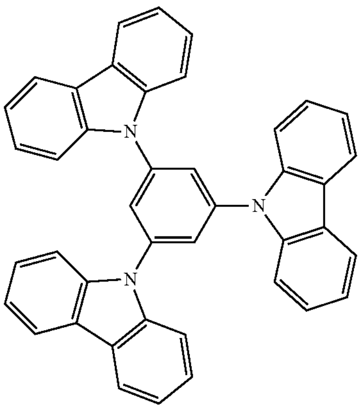

<TCP>

-continued

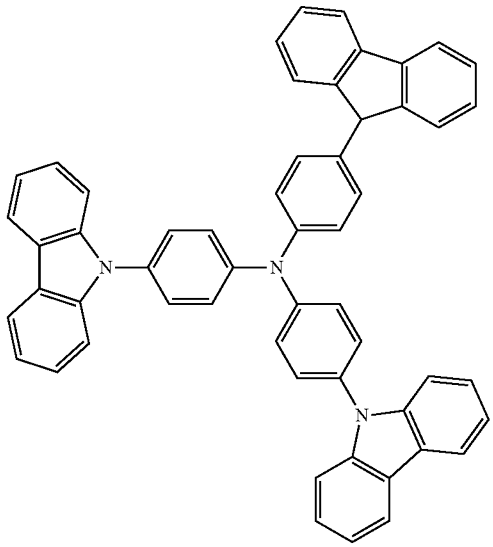

<TCTA>

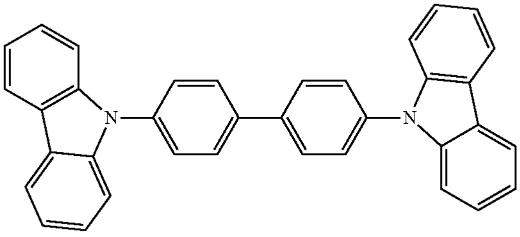

<CBP>

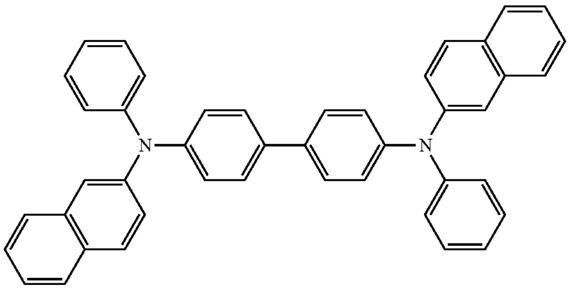

<β-NPB>

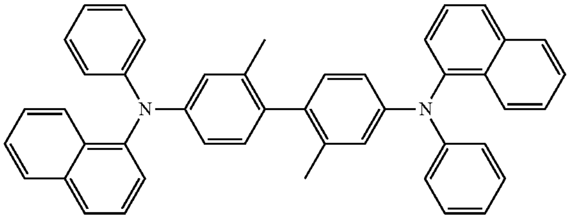

<α-NPD>

-continued

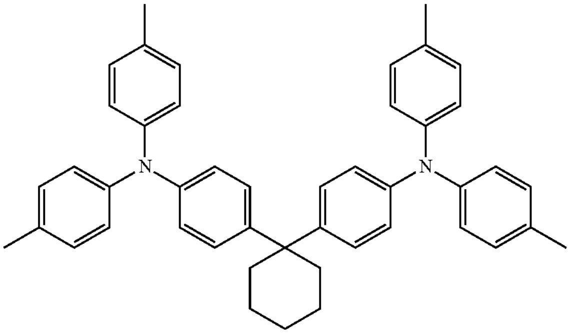

<TAPC>

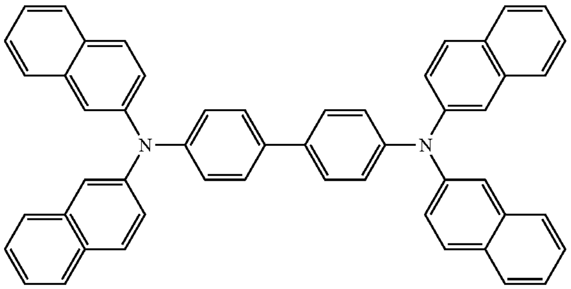

<β-TNB>

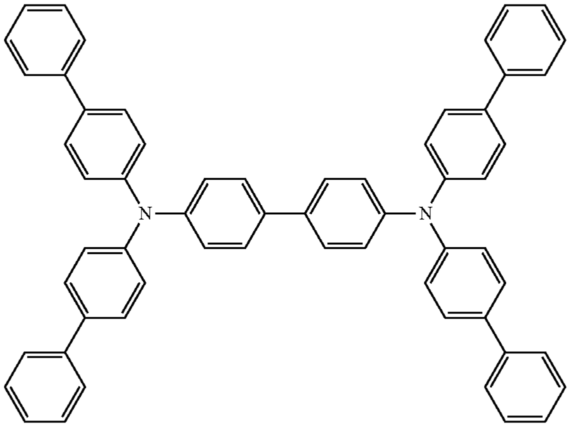

<TPD15>

At least one of red, green and blue dopants may be used as the dopant of the light emitting layer 140.

The red dopant of the light emitting layer 140 that may be used herein may include rubrene(5,6,11,12-tetraphenylnaphthacene), Pt(II) octaethylporphine (PtOEP), tris(1-phenylisoquinoline)iridium(III) (Ir(piq)$_3$), bis(1-phenylisoquinoline)(acetylacetonate)iridium(III) (Ir(piq)2(acac)), Btp$_2$Ir (acac), 5,6,11,12-tetraphenylnaphthacene (rubrene), etc., but the present invention is not limited thereto.

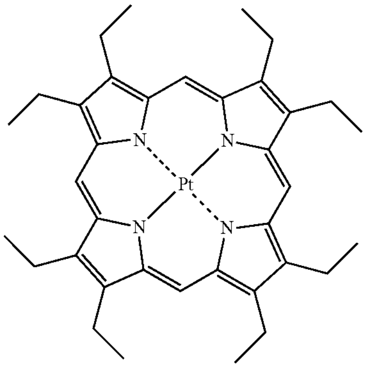

PtOEP

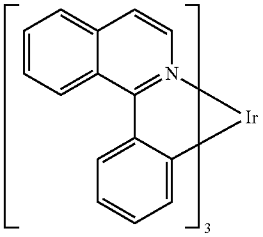

Ir(piq)$_3$

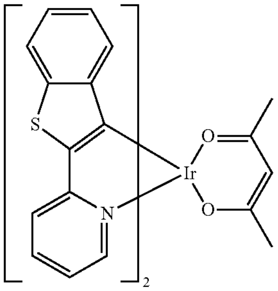

Btp$_2$Ir(acac)

The green dopant of the light emitting layer 140 that may be used herein may include tris(2-phenylpyridine)iridium (III) (Ir(ppy)$_3$), bis(2-phenylpyridine)(acetylacetonate) iridium(III) (Ir(ppy)$_2$(acac)), Ir(mpyp)$_3$, 10-(2-benzothiazolyl)-1,1,7,7-tetramethyl-2,3,6,7-tetrahydro-1H,5H,11H-[1] benzopyrano[6,7,8-ij]quinolizin-11-one (C545T; see the following Formulas), etc., but the present invention is not limited thereto.

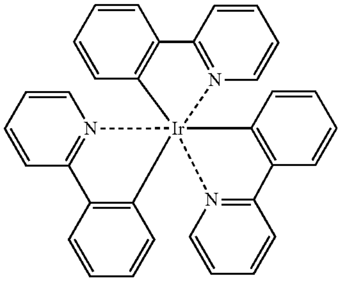

Ir(ppy)$_3$

-continued

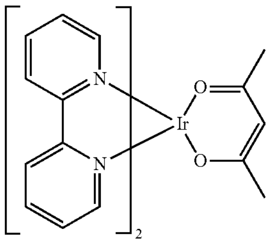

$Ir(ppy)_2(acac)$

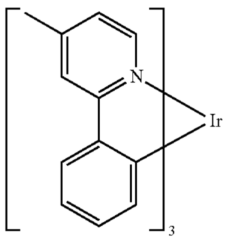

$Ir(mpyp)_3$

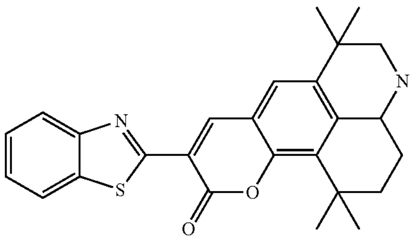

C545T

Meanwhile, the blue dopant of the light emitting layer 140 that may be used herein may include bis(3,5-difluoro-2-(2-pyridyl)phenyl-(2-carboxypyridyl)iridium(III) (FIrPic), $F_2Irpic$, $(F_2ppy)_2Ir(tmd)$, $Ir(dfppz)_3$, ter-fluorene(fluorene), 4,4'-bis[4-(di-p-tolylamino)styryl] biphenyl (DPAVBi), 2,5,8,11-tetra-tert-butyl perylene (TBP), etc., but the present invention is not limited thereto.

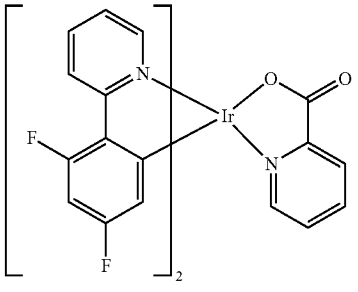

$F_2Irpic$

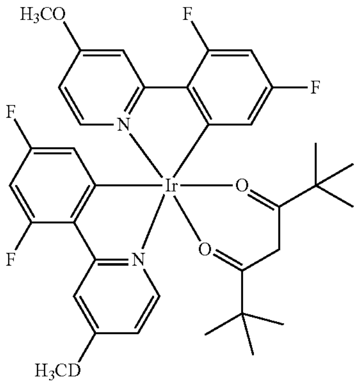

$(F_2ppy)_2Ir(tmd)$

-continued

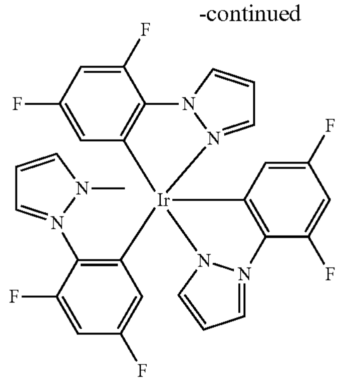

$Ir(dfppz)_3$

There are various possible modified embodiments in which the light emitting layer 140 may include one of the red, green, and blue dopants to realize red light, green light, and blue light, respectively, or include at least two of the red, green and blue dopants to realize white light.

The light emitting layer 140 may have a thickness of 2 nm to 100 nm, for example, 10 nm to 60 nm. When the thickness of the light emitting layer satisfies this thickness range, excellent luminescence characteristics may be obtained without an increase in driving voltage.

A hole blocking layer (not shown in FIG. 3) serves to prevent triplet excitons or holes of the light emitting layer 140 (for example, when the light emitting layer 140 includes a phosphorescent compound) from being dispersed into the cathode, and may be further formed on the light emitting layer 140. Here, the hole blocking layer may be formed according to a method optionally selected from various known methods such as vacuum deposition, spin coating, casting, an LB method, etc. In this case, the deposition and coating conditions vary according to the type of a target compound, a desired layer structure, and thermal characteristics, but may be chosen within a similar range of the conditions used to form the light emitting layer 140 as described above.

The hole blocking material may be optionally selected from known hole blocking materials. For example, oxadiazole derivatives, triazole derivatives, phenanthroline derivatives, and the like may be used.

The hole blocking layer may have a thickness of approximately 5 nm to 100 nm, for example, 10 nm to 30 nm. When the thickness of the hole blocking layer satisfies this thickness range, excellent hole blocking characteristics may be obtained without an increase in driving voltage.

The electron transport layer 150 may be formed on the light emitting layer 140 or the hole blocking layer using a method optionally selected from various known methods such as vacuum deposition, spin coating, casting, an LB method, etc. In this case, the deposition and coating conditions vary according to the type of a target compound, a desired layer structure, and thermal characteristics, but may be chosen within a similar range of the conditions used to form the hole injection layer as described above.

A known electron transport material may be used as a material of the electron transport layer 150. For example, known materials such as tris(8-quinolinolato)aluminum ($Alq_3$), TAZ, 2-(4-biphenyl)-5-(4-tert-butylphenyl)-1,3,4-oxadiazole (PBD), 4,7-diphenyl-1,10-phenanthroline (Bphen), BCP, $BeBq_2$, BAlq, and the like may be used as the material of the electron transport layer 150.

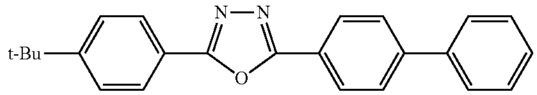

PBD

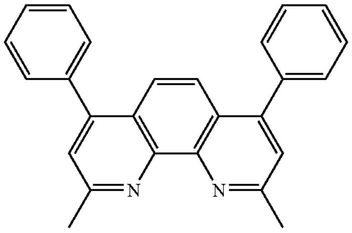

BCP

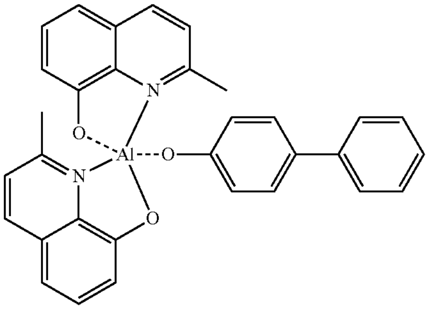

BAlq

The electron transport layer 150 may have a thickness of approximately 10 nm to 100 nm, for example, 20 nm to 50 nm. When the thickness of the electron transport layer 150 satisfies this thickness range, excellent electron transport characteristics may be obtained without an increase in driving voltage.

The electron injection layer 160 may be formed on the electron transport layer 150. Known electron injection materials, for example, LiF, NaCl, NaF, CsF, $Li_2O$, BaO, $BaF_2$, $Cs_2CO_3$, lithium quinolate (Liq), and the like, may be used as a material used to form the electron injection layer. In this case, the deposition conditions of the electron injection layer 160 vary according to the type of a compound used, but may be generally chosen within substantially the same range of the conditions used to form the hole injection layer.

The electron injection layer 160 has a thickness of approximately 0.1 nm to 10 nm, for example, 0.5 nm to 5 nm. When the thickness of the electron injection layer 160 satisfies this thickness range, a satisfactory level of electron injection characteristics may be obtained without a substantial increase in driving voltage.

Also, the electron injection layer may include the metal derivative, such as LiF, NaCl, CsF, NaF, $Li_2O$, BaO, or $Cs_2CO_3$, at a content of 1 mole % to 50 mole % for the material of the electron transport layer, such as $Alq_3$, TAZ, Balq, $Bebq_2$, BCP, TBPI, TmPyPB, or TpPyPB, and thus may also be formed as a layer having a thickness of 1 nm to 100 nm, in which the material of the electron transport layer is doped with a metal such as Li, Ca, Cs, and Mg.

The cathode 170 may be a cathode (i.e., an electron injection electrode), and a metal having a relatively low work function, an alloy, an electrically conductive compound, and a combination thereof may be used as the cathode 170. Specific examples of the cathode 170 may include lithium (Li), magnesium (Mg), aluminum (Al), aluminum-lithium (Al—Li), calcium (Ca), magnesium-indium (Mg—In), magnesium-silver (Mg—Ag), etc. Also ITO, IZO, and the like may be used to obtain top emission devices.

Figure 4:
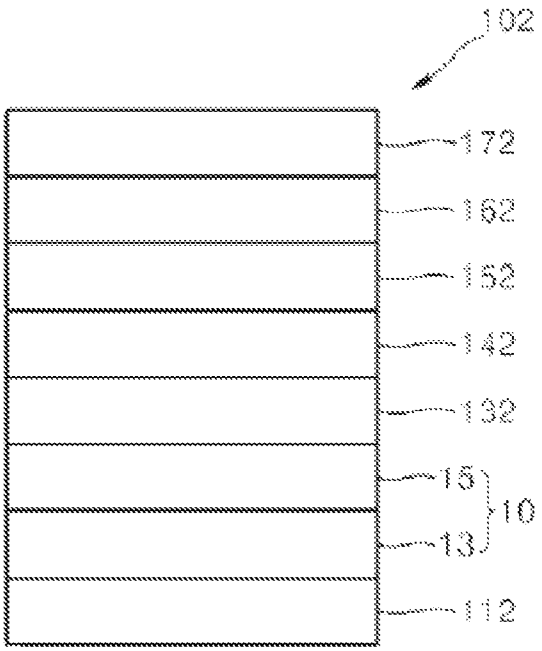
FIG. 4 is a schematic cross-sectional view of an organic light-emitting device that is an electronic element according to still another embodiment of the present invention.

FIG. 4 is a schematic cross-sectional view of an organic light-emitting device 102 according to still another embodiment of the present invention. The organic light-emitting device 102 includes a substrate 112, a conductive thin film 10, a hole transport layer 132, a light emitting layer 142, an electron transport layer 152, an electron injection layer 162, and a cathode 172. The conductive thin film 10 includes a conductive layer 13, and a surface energy-tuning layer 15. In this case, the conductive layer 13 is disposed at a side of the substrate 112, and the surface energy-tuning layer 15 is disposed at a side of the light emitting layer 142. That is, the conductive thin film 10 serves as an anode.

For detailed descriptions of the substrate 112, the hole transport layer 132, the light emitting layer 142, the electron transport layer 152, the electron injection layer 162, and the cathode 172 in the organic light-emitting device 102, see the descriptions of the corresponding layers as described above.

The hole transport layer 132 may be formed according to a method optionally selected from various known methods such as vacuum deposition, spin coating, casting, an LB method, etc. In this case, when the vacuum deposition method is selected, the deposition conditions vary according to a target compound, a desired layer structure, and thermal characteristics, but may, for example, be chosen within a deposition temperature range of 100 to 500° C., a vacuum degree range of $10^{-10}$ to $10^{-3}$ torr, and a deposition rate range of 0.01 to 100 Å/sec. On the other hand, when the spin coating method is selected, the coating conditions vary according to a target compound, a desired layer structure, and thermal characteristics, but may be chosen within a coating speed range of 2,000 rpm to 5,000 rpm, and a heat treatment temperature of 80° C. to 200° C. (a heat treatment temperature used to remove a solvent after coating).

The hole transport layer 132 may have a thickness of 5 nm to 100 nm, for example, 10 nm to 60 nm. When the thickness of the hole transport layer 132 satisfies this thickness range, excellent hole transport characteristics may be obtained without an increase in driving voltage.

A material of the hole transport layer 132 may be selected from materials that may better transport the holes than inject the holes. The hole transport layer 132 may be formed using known hole transport materials. For example, such a hole transport material may be an amine-based material having an aromatic condensed ring, or may be a triphenylamine-based material.

More specifically, examples of the hole transporting material may include 1,3-bis(carbazol-9-yl)benzene (MCP), 1,3,5-tris(carbazol-9-yl)benzene (TCP), 4,4',4"-tris(carbazol-9-yl)triphenylamine (TCTA), 4,4'-bis(carbazol-9-yl)biphenyl (CBP), N,N'-bis(naphthalen-1-yl)-N,N'-bis(phenyl)benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), di-[4,-(N,N-ditolyl-amino)-phenyl]cyclohexane (TAPC), N,N,N',N"-tetra-naphthalen-2-yl-benzidine (β-TNB), N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenediamine) (PFB), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), poly(9,9-dioctyl-fluorene-co-bis-N,N'-(4-methoxyphenyl)-bis-N,N'-phenyl-1,4-phenylenediamine) (PFMO), etc., but the present invention is not limited thereto.

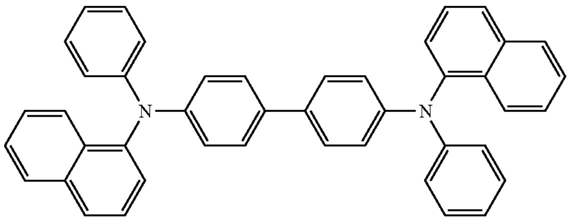
<NPB>
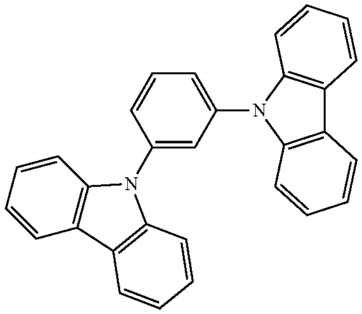
<MCP>
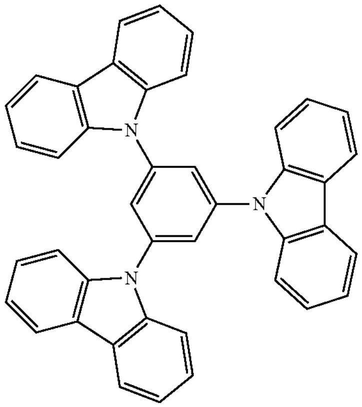
<TCP>
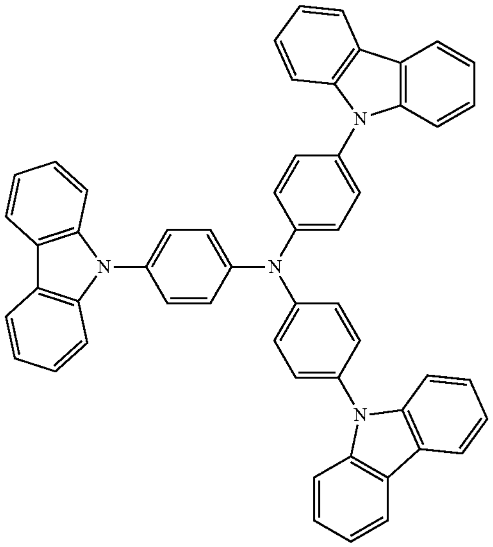
<TCTA>
-continued
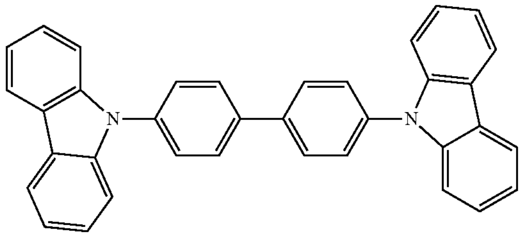
<CBP>
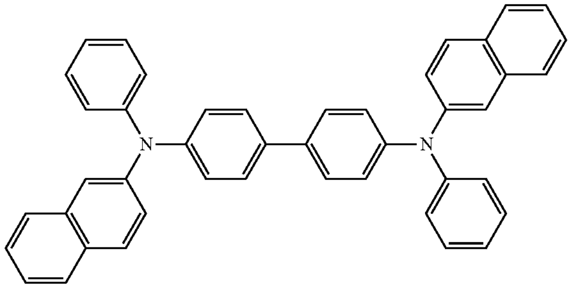
<β-NPB>
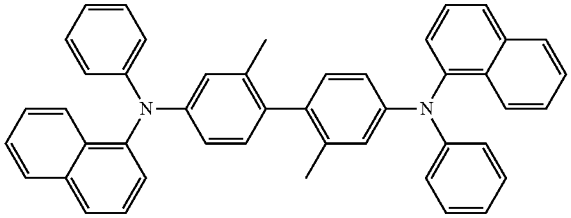
<α-NPD>
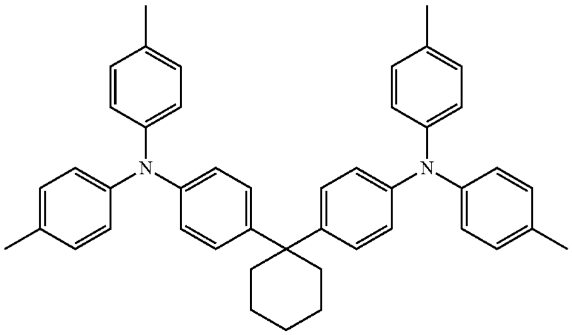
<TAPC>
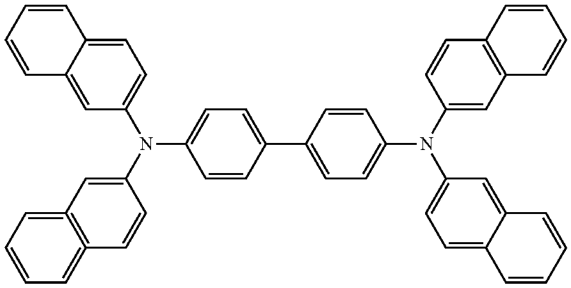
<β-TNB>

-continued

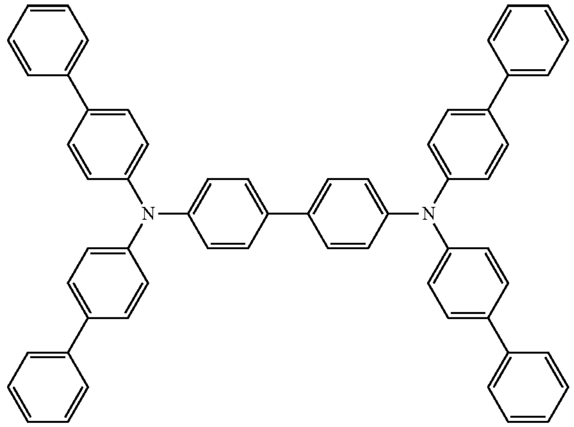

<TPD15>

The hole transport layer 132 may be formed according to a method optionally selected from various known methods such as vacuum deposition, spin coating, casting, an LB method, etc. In this case, when the vacuum deposition method is selected, the deposition conditions vary according to a target compound, a desired layer structure, and thermal characteristics, but may, for example, be chosen within a deposition temperature range of 100 to 500° C., a vacuum degree range of $10^{-10}$ to $10^{-3}$ torr, and a deposition rate range of 0.01 to 100 Å/sec. On the other hand, when the spin coating method is selected, the coating conditions vary according to a target compound, a desired layer structure, and thermal characteristics, but may be chosen within a coating speed range of 2,000 rpm to 5,000 rpm, and a heat treatment temperature of 80° C. to 200° C. (a heat treatment temperature used to remove a solvent after coating).

The surface energy-tuning layer 15, which includes the second fluorine-based material but does not include the conductive polymer, is arranged below the hole transport layer 132. Here, since the absolute value of an ionization potential level of the surface energy-tuning layer 15 is higher than the absolute value of an ionization potential (or HOMO energy) level of the hole transport layer 132, the transport of holes from the surface energy-tuning layer 15 to the hole transport layer 132 may be smoothly achieved. In addition, since high conductivity of the conductive thin film 10 is maintained by the conductive layer 13 including the conductive polymer and the first fluorine-based material, the injection of holes from the conductive layer 13 to the surface energy-tuning layer 15 may be smoothly achieved, thereby improving the efficiency of injection and transport of holes from the conductive thin film 10 to the light emitting layer 142. As a result, since the exciton generation efficiency at the light emitting layer 142 may be enhanced, the organic light-emitting device 102 may have characteristics such as high efficiency, low driving voltage, long lifetime, etc.

According to one embodiment, an auxiliary conductive thin film layer (not shown in FIG. 4) configured to improve conductivity of the anode or improve optical characteristics and give a surface plasmon effect may be provided between the substrate 112 and the conductive thin film 10 serving as the anode.

The auxiliary conductive thin film layer may be formed by providing at least one of a conductive polymer (the conductivity of the conductive polymer is greater than or equal to 100 S/cm), metallic carbon nanotubes, graphene, reduced graphene oxide, metal nanowires, a metal grid, carbon nanodots, semiconductor nanowires, and metal nanodots onto the substrate 110 using methods such as spin coating, casting, an LB method, ink-jet printing, nozzle printing, slot-die coating, doctor blade coating, screen printing, dip coating, gravure printing, reverse-offset printing, a physical transfer method, spray coating, chemical vapor deposition, thermal evaporation, etc.

The auxiliary conductive thin film layer may be formed by applying a mixture, which includes i) at least one of a conductive polymer, metallic carbon nanotubes, graphene, reduced graphene oxide, metal nanowires, carbon nanodots, semiconductor nanowires, and metal nanodots, and ii) a third solvent, onto a substrate, and heat-treating the mixture to remove the third solvent. For examples of the third solvent, see the examples of the above-described first and second solvents.

According to one embodiment, when the auxiliary conductive thin film layer includes the graphene, the auxiliary conductive thin film layer may be formed by physically transferring a graphene sheet onto the substrate 112.

According to still another embodiment, when the auxiliary conductive thin film layer includes the metallic carbon nanotubes, the auxiliary conductive thin film layer may be formed by growing the metallic carbon nanotubes on the substrate 112 or providing the carbon nanotubes dispersed in a solvent onto the substrate 112 using a solution-based printing method (i.e., a spray coating, spin coating, dip coating, gravure coating, reverse-offset coating, screen printing, or slot-die coating method) and removing the solvent.

According to yet another embodiment, when the auxiliary conductive thin film layer includes the metal grid, the auxiliary conductive thin film layer may be formed by vacuum-depositing a metal onto the substrate 112 to form a metal film and patterning the metal film in various mesh shapes using photolithography, or dispersing a metal precursor or metal particles in a solvent and subjecting the resulting dispersion to a printing method (i.e., a spray coating, spin coating, dip coating, gravure coating, reverse-offset coating, screen printing, or slot-die coating method).

Figure 5:
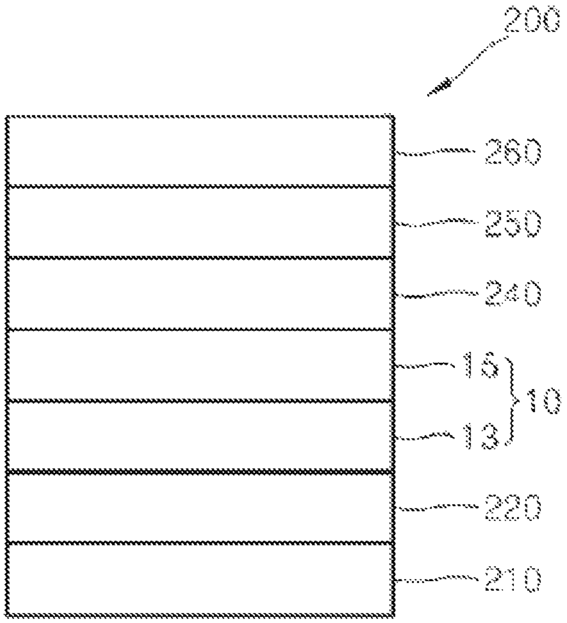
FIG. 5 is a schematic cross-sectional view of an organic solar cell that is an electronic element according to still another embodiment of the present invention.

FIG. 5 is a diagram schematically showing an organic solar cell 200 according to one embodiment of the present invention.

The organic solar cell 200 shown in FIG. 5 may include a substrate 210, an anode 220, a conductive thin film 10, a heterojunction layer 240, an electron extraction layer 250, and a cathode 260. Light radiated to the organic solar cell 200 is dissociated into holes and electrons at the heterojunction layer 240 so that the electrons can move to the cathode 260 via the electron extraction layer 250 and the holes can move to the anode 220. That is, the conductive thin film 10 of the organic solar cell 200 serves as the hole extraction layer.

For descriptions of the substrate 210 and the anode 220, see the descriptions of the substrate 110 and the anode 120.

The heterojunction layer 240 may include a material capable of dissociating the holes and the electrons from the radiated light. For example, the heterojunction layer 240 may include a p-type organic semiconductor material, and an n-type organic semiconductor material. For example, the heterojunction layer 240 may include poly(3-hexylthiophene), and phenyl-$C_{61}$-butyric acid methyl ester (PCMB), but the present invention is not limited thereto.

The surface energy-tuning layer 15, which includes the second fluorine-based material but does not include the conductive polymer, is arranged below the heterojunction layer 240. Here, since the absolute value of a HOMO energy level of the surface energy-tuning layer 15 is higher than the absolute value of a HOMO energy level of the heterojunction layer 240, the transport of holes from the heterojunction layer 240 to the surface energy-tuning layer 15 may be smoothly achieved. In addition, since high conductivity of the conductive thin film 10 is maintained by the conductive layer 13 which is disposed at a side of the anode 220 and includes the conductive polymer and the first fluorine-based material, the injection of holes from the surface energy-tuning layer 15 to the anode 220 via the conductive layer 13 may be effectively achieved. As a result, the organic solar cell 200 may have high photovoltaic efficiency.

The electron extraction layer 250 may be made of a material capable of accepting electrons. For example, the material of the electron injection layer 160 of the organic light-emitting device 100 as described above may be used.

A metal having a relatively low work function, an alloy, an electrically conductive compound, and a combination thereof may be used as the cathode 260. Specific examples of the cathode 260 may include lithium (Li), magnesium (Mg), aluminum (Al), aluminum-lithium (Al—Li), calcium (Ca), and magnesium-indium (Mg—In), magnesium-silver (Mg—Ag), etc.

Figure 6:
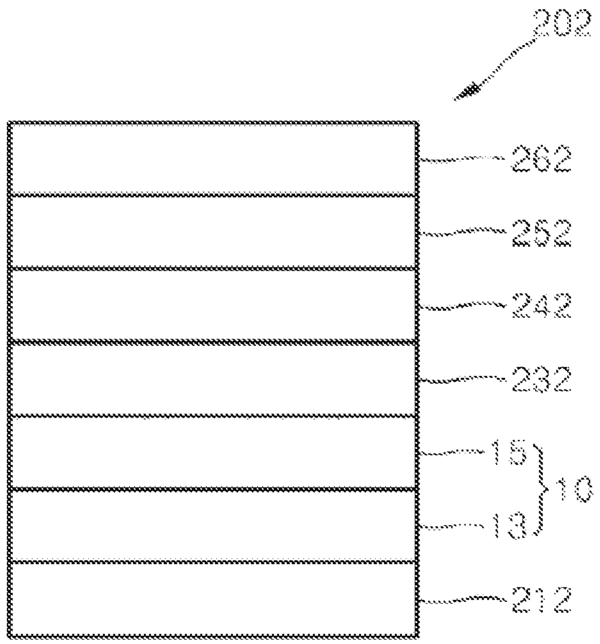
FIG. 6 is a schematic cross-sectional view of an organic solar cell that is an electronic element according to yet another embodiment of the present invention.

FIG. 6 is a diagram schematically showing an organic solar cell 202 according to one embodiment of the present invention.

The organic solar cell 202 shown in FIG. 6 may include a substrate 212, a conductive thin film 10, a hole extraction layer 232, a heterojunction layer 242, an electron extraction layer 252, and a cathode 262. Light radiated onto the organic solar cell 202 is dissociated into holes and electrons at the heterojunction layer 242 so that the electrons can move to the cathode 262 via the electron extraction layer 252 and the holes can move to the conductive thin film 10 via the hole extraction layer 232. That is, the conductive thin film 10 of the organic solar cell 202 serves as the anode.

For descriptions of the substrate 212, the heterojunction layer 242, the electron extraction layer 252, and the cathode 262, see the descriptions of the substrate 210, the heterojunction layer 240, the electron extraction layer 250, and the cathode 260.

The hole extraction layer 232 may be a material capable of transporting the holes to the conductive thin film 10 serving as the anode. For example, the material of the hole transport layer 132 of the organic light-emitting device 102 may be used.

The surface energy-tuning layer 15, which includes the second fluorine-based material but does not include the conductive polymer, is arranged below the hole extraction layer 232. Here, since the absolute value of an ionization potential level of the surface energy-tuning layer 15 is higher than the absolute value of an ionization potential (or HOMO energy) level of the hole extraction layer 232, the transport of holes from the hole extraction layer 232 to the surface energy-tuning layer 15 may be smoothly achieved. In addition, since high conductivity of the conductive thin film 10 serving as the anode is maintained by the conductive layer 13 including the conductive polymer and the first fluorine-based material, the injection of holes from the hole extraction layer 232 to the conductive layer 13 via the surface energy-tuning layer 15 may be effectively achieved. As a result, the organic solar cell 202 may have high photovoltaic efficiency.

According to yet another embodiment, the auxiliary conductive thin film layer as described above in FIG. 4 may be further formed between the substrate 212 and the conductive thin film 10 serving as the anode.

Meanwhile, the conductive layer 13 or 23 of the conductive thin film 10 or 20 as described above may further include at least one additive selected from the group consisting of carbon nanotubes, graphene, reduced graphene oxide, metal nanowires, metal carbon nanodots, semiconductor quantum dots, semiconductor nanowires, and metal nanodots in addition to the conductive polymer and the first fluorine-based material. The conductivity of the conductive thin film 10 or 20 may be further improved due to the presence of the additive.

As described above, the electronic element has been described with reference to FIGS. 3 to 6, but the present invention is not limited thereto.

Although the present invention has been described with reference to embodiments thereof shown in the accompanying drawings, it will be appreciated by those skilled in the art that the detailed description proposed herein is merely an example for the purpose of illustrations only, and various modifications and their equivalents could be made thereto without departing from the scope of the invention. Thus, it should be understood that the scope of the prevent invention is defined not by the detailed description, but by the appended claims and their equivalents.

EXAMPLES

Comparative Example 1

Production of Conductive Layer

For a conductive layer, a mixture including a highly conductive poly(3,4-ethylenedioxythiophene):poly(styrenesulfonate) (PEDOT:PSS) solution (PH500 commercially available from H.C. Starck GmbH; in which the content of PSS per 1 part by weight of PEDOT was 2.5 parts by weight, and which had a conductivity of 0.3 S/cm), a solution of the following polymer 100 (5% by weight of polymer 100 was dispersed in a mixture of water and alcohol (water:alcohol=4.5:5.5 (v/v)); commercially available from Aldrich Co. Ltd.), and 5% by weight of dimethyl sulfoxide (DMSO) was prepared. Here, the mixture ratio of the PEDOT:PSS solution and the solution of polymer 100 was adjusted so that the content (based on solid contents) of polymer 100 per 1 part by weight of PEDOT was 1.0 parts by weight.

<Polymer 100>

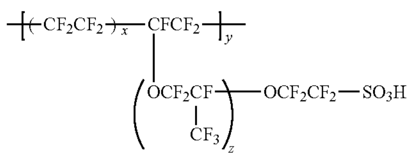

(In polymer 100, x=1,300, y=200, and z=1)

The mixture was spin-coated onto a PET substrate, and then heat-treated at 150° C. for 20 minutes to form a conductive layer 1 having a thickness of 100 nm. The conductivity of the work function-tuning layer 1 was 125 S/cm (measured using a 4-point probe).

Next, each of conductive layers 2, 3 and 4 was produced onto a PET substrate in the same manner as in the method for producing the conductive layer 1, except that the mixture ratio of the PEDOT:PSS solution and the solution of polymer 100 was adjusted so that the contents of polymer 100 per 1 part by weight of PEDOT were 2.3 parts by weight, 4.9 parts by weight, and 11.2 parts by weight, and the conductive layers were then formed.

The conductivities of the conductive layers 2, 3 and 4 were 75 S/cm, 61 S/cm, and 50 S/cm (measured using a 4-point probe), respectively [see Table 1]. Then, the conductivity was measured using DSA100 commercially available from KRÜSS GmbH, and the surface energy was then measured using an Owens-Wendt method [see Table 1].

Comparative Example a

An electrode A was produced in the same manner as in the method for producing the conductive layer 1, except that a mixture including the PEDOT:PSS (PH500 commercially available from H.C. Starck GmbH) solution and 5% by weight of DMSO but not including the solution of polymer 100 was used to form a thin film.

TABLE 1

| | PEDOT/PSS/ polymer 100 (weight ratio) | Work function (eV) | Conductivity (S/cm) | Surface energy (mN/m) |
|---|---|---|---|---|
| Electrode A | 1/2.5/0 | 4.73 | 300 | ~38 |
| Conductive layer 1 | 1/2.5/1.0 | 5.07 | 125 | ~21 |
| Conductive layer 2 | 1/2.5/2.3 | 5.23 | 75 | ~21 |
| Conductive layer 3 | 1/2.5/4.9 | 5.64 | 61 | ~22 |
| Conductive layer 4 | 1/2.5/11.2 | 5.80 | 50 | ~23 |

Example 1

Production of Conductive Thin Film (Including Conductive Layer and Surface Energy-Tuning Layer)

A solution obtained by diluting the solution of polymer 100 with isopropyl alcohol (1:10, v/v) was spin-coated onto the conductive layer 1 described in Comparative Example 1, and heat-treated at 150° C. for 20 minutes to form a surface energy-tuning layer including the polymer 100 on the conductive layer 1, thereby forming a conductive thin film 1 (including the conductive layer 1 plus the surface energy-tuning layer), which was formed on a PET substrate and had a thickness of 100 nm.

This procedure was repeatedly performed on the conductive layers 2, 3 and 4, respectively, to produce a conductive thin film 2 (including the conductive layer 2 plus the surface energy-tuning layer), a conductive thin film 3 (including the conductive layer 3 plus the surface energy-tuning layer), and conductive thin film 4 (including the conductive layer 4 plus the surface energy-tuning layer), all of which were formed on PET substrates and had a thickness of 100 nm. The conductivities and surface energies of the conductive thin films 1, 2, 3 and 4 were measured using a 4-point probe. The evaluation results are listed in the following Table 2.

TABLE 2

| | PEDOT/PSS/ polymer 100 (weight ratio) | Work function (eV) | Conductivity (S/cm) | Surface energy (mN/m) |
|---|---|---|---|---|
| Conductive thin film 1 | 1/2.5/1.0 | 5.95 | 115 | ~20 |
| Conductive thin film 2 | 1/2.5/2.3 | 5.95 | 72 | ~20 |
| Conductive thin film 3 | 1/2.5/4.9 | 5.95 | 60 | ~20 |
| Conductive thin film 4 | 1/2.5/11.2 | 5.95 | 49 | ~20 |

Evaluation Example 1

Conductive Thin Film Evaluation

<Evaluation of Work Function and Conductivity>

The work functions of the conductive layers 1 to 4, the conductive thin films 1 to 4, and the electrode A were evaluated using ultraviolet photoelectron spectroscopy in air (commercially available from Niken Keiki; Model Name: AC2). The evaluation results are as listed in Tables 1 and 2.

Example 2

Production of OLED

As an anode, a conductive thin film 1 was formed on a glass substrate according to the method described in Example 1, and a 15 nm-thick TAPC hole transport layer, a 5 nm-thick TCTA:Ir(ppy)$_3$ light emitting layer (where the content of Ir(ppy)$_2$(acac) was 3% by weight), a 5 nm-thick CBP:Ir(ppy)$_3$ light emitting layer (where the content of Ir(ppy)$_3$ was 4% by weight), a 55 nm-thick TPBI electron transport layer, a 1 nm-thick LiF electron injection layer, and a 110 nm-thick Al cathode were sequentially formed on the anode (this entire procedure was performed using a vacuum deposition method) to produce OLED 1.

Comparative Example 1

OLED A was produced in the same manner as in Example 2, except that the conductive layer 1 of Comparative Example 1 was used as the anode instead of the conductive thin film 1.

Comparative Example 2

OLED B was produced in the same manner as in Example 2, except that the electrode A of Comparative Example A was used as the anode instead of the conductive thin film 1.

Evaluation Example 2

Evaluation of OLEDs

The efficiency, brightness, and lifetime of the OLEDs 1 and A to B were evaluated using a Keithley 236 Source measurement unit and a Minolta CS 2000 spectroradiometer. The evaluation results are listed in the following Table 3. As a result, it could be seen that the OLED 1 showed superior efficiency to the OLEDs A and B.

TABLE 3

| | Current emission efficiency (cd/A) |
|---|---|
| OLED 1 | 97 |
| OLED A | 73 |
| OLED B | 45 |

BRIEF DESCRIPTION OF MAIN PARTS IN THE DRAWINGS

120: anode

10: conductive thin film

13: conductive layer (including a conductive polymer and a first fluorine-based material)

15: surface energy-tuning layer (including a second fluorine-based material, but not including a conductive polymer)

140: light emitting layer

150: electron transport layer

160: electron injection layer

170: cathode

The invention claimed is:

1. A conductive thin film comprising a conductive layer and a surface energy-tuning layer, wherein the conductive layer comprises a conductive polymer and a first fluorine-based material, the surface energy-tuning layer comprises a second fluorine-based material but does not comprise the conductive polymer, and the first fluorine-based material and the second fluorine-based material are the same or different from each other.

2. The conductive thin film of claim 1, wherein the conductive polymer comprises polythiophene, polyaniline, polypyrrole, polystyrene, polyethylenedioxythiophene, polyacetylene, polyphenylene, polyphenylvinylene, polycarbazole, a copolymer comprising two or more different repeating units thereof, a derivative thereof, or a blend of two or more types thereof.

3. The conductive thin film of claim 1, wherein the conductive polymer comprises a self-doped conductive polymer doped with one or more types of an ionic group and a polymeric acid, the ionic group comprises an anionic group, and a cationic group disposed to counter the anionic group, the anionic group is selected from the group consisting of $PO_3^{2-}$, $SO_3^-$, $COO^-$, $I^-$, $CH_3COO^-$, and $BO_2^{2-}$, the cationic group comprises one or more types among a metal ion and an organic ion, the metal ion is selected from the group consisting of $Na^+$, $K^+$, $Li^+$, $Mg^{+2}$, $Zn^{+2}$, and $Al^{+3}$, and the organic ion is selected from the group consisting of $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (R is $CH_3(CH_2)_n$—; and n is an integer ranging from 0 to 50).

4. The conductive thin film of claim 1, wherein the first fluorine-based material and the second fluorine-based material are each independently an ionomer represented by the following Formula 1:

<Formula 1>

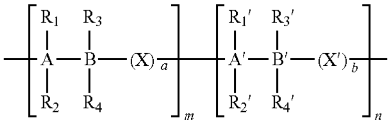

wherein $0<m\leq 10{,}000{,}000$, $0\leq n<10{,}000{,}000$, $0\leq a\leq 20$, and $0\leq b\leq 20$;

A, B, A', and B' are each independently selected from the group consisting of C, Si, Ge, Sn, and Pb;

$R_1$, $R_2$, $R_3$, $R_4$, $R_1'$, $R_2'$, $R_3'$, and $R_4'$ are each independently selected from the group consisting of hydrogen, a halogen, a nitro group, a substituted or unsubstituted amino group, a cyano group, a substituted or unsubstituted $C_1$-$C_{30}$ alkyl group, a substituted or unsubstituted $C_1$-$C_{30}$ heteroalkyl group, a substituted or unsubstituted $C_1$-$C_{30}$ alkoxy group, a substituted or unsubstituted $C_1$-$C_{30}$ heteroalkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_1$-$C_{30}$ heteroalkylester group, a substituted or unsubstituted $C_6$-$C_{30}$ arylester group and, and a substituted or unsubstituted $C_2$-$C_{30}$ heteroarylester group, provided that at least one of $R_1$, $R_2$, $R_3$, and $R_4$ is an ionic group, or comprises the ionic group; and X and X' are each independently selected from the group consisting of a simple bond, O, S, a substituted or unsubstituted $C_1$-$C_{30}$ alkylene group, a substituted or unsubstituted $C_1$-$C_{30}$ heteroalkylene group, a substituted or unsubstituted $C_6$-$C_{30}$ arylene group, a substituted or unsubstituted $C_6$-$C_{30}$ arylalkylene group, a substituted or unsubstituted $C_2$-$C_{30}$ heteroarylene group, a substituted or unsubstituted $C_2$-$C_{30}$ heteroarylalkylene group, a substituted or unsubstituted $C_5$-$C_{20}$ cycloalkylene group, a substituted or unsubstituted $C_5$-$C_{30}$ heterocycloalkylene group, a substituted or unsubstituted $C_6$-$C_{30}$ arylester group, and a substituted or unsubstituted $C_2$-$C_{30}$ heteroarylester group, provided that, when n is 0, at least one of $R_1$, $R_2$, $R_3$, and $R_4$ is a hydrophobic functional group containing a halogen element, or comprises the hydrophobic functional group.

5. The conductive thin film of claim 4, wherein the ionic group comprises an anionic group, and a cationic group disposed to counter the anionic group, the anionic group is selected from the group consisting of $PO_3^{2-}$, $SO_3^-$, $COO^-$, $I^-$, $CH_3COO^-$, and $BO_2^{2-}$, the cationic group comprises one or more types among a metal ion and an organic ion, the metal ion is selected from the group consisting of $Na^+$, $K^+$, $Li^+$, $Mg^{+2}$, $Zn^{-2}$, and $Al^{+3}$, and the organic ion is selected from the group consisting of $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, and $RCHO^+$ (R is $CH_3(CH_2)_n$—; and n is an integer ranging from 0 to 50).

6. The conductive thin film of claim 4, wherein the hydrophobic functional group is a halogen element.

7. The conductive thin film of claim 1, wherein the first fluorine-based material and the second fluorine-based material are each independently an ionomer comprising one or more types among repeating units represented by the following Formulas 2 to 13:

<Formula 2>

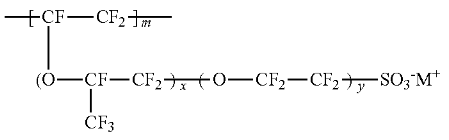

wherein m is an integer ranging from 1 to 10,000,000, x and y are each independently an integer ranging from 0 to 10, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 3>

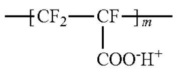

wherein m is an integer ranging from 1 to 10,000,000;

<Formula 4>

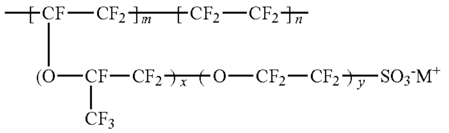

wherein m and n are $0<m\leq10,000,000$, and $0\leq n<10,000,000$, respectively, x and y are each independently an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 5>

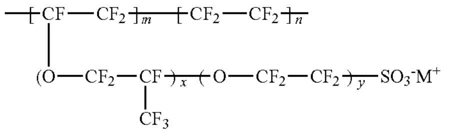

wherein m and n are $0<m\leq10,000,000$, and $0\leq n<10,000,000$, respectively, x and y are each independently an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 6>

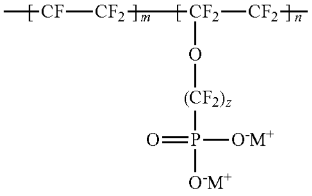

wherein m and n are $0<m\leq10,000,000$, and $0\leq n<10,000,000$, respectively, z is an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 7>

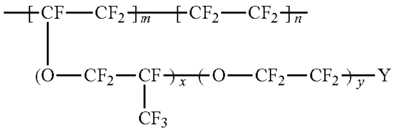

wherein m and n are $0<m\leq10,000,000$, and $0\leq n<10,000,000$, respectively, x and y are each independently an integer ranging from 0 to 20, Y is one selected from the group consisting of $—COO^-M^+$, $—SO_3^-NHSO_2CF_3^+$, and $—PO_3^{2-}(M^+)_2$, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging, from 0 to 50);

<Formula 8>

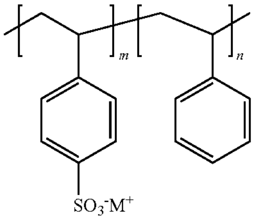

wherein m and n are $0<m\leq10,000,000$, and $0\leq n<10,000,000$, respectively, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 9>

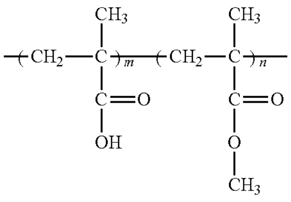

wherein m and n are $0<m\leq 10{,}000{,}000$, and $0\leq n<10{,}000{,}000$, respectively;

<Formula 10>

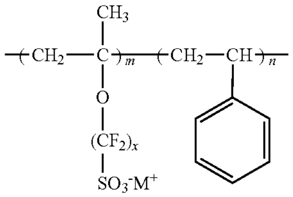

wherein m and n are $0<m\leq 10{,}000{,}000$, and $0\leq n<10{,}000{,}000$, respectively, x is an integer ranging from 0 to 20, and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 11>

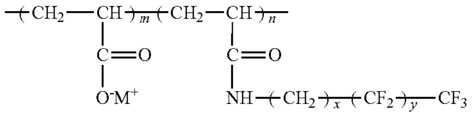

wherein m and n are $0<m\leq 10{,}000{,}000$, and $0\leq n<10{,}000{,}000$, respectively, x and y are each independently an integer ranging from 0 to 20, $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 12>

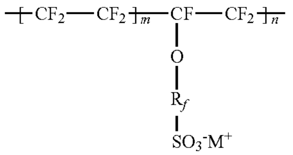

wherein m and n are $0\leq m<10{,}000{,}000$, and $0<n\leq 10{,}000{,}000$, respectively, $R_f$ is —$(CF_2)_z$— (z is an integer ranging from 1 to 50, provided that z is not 2), —$(CF_2CF_2O)_zCF_2CF_2$— (z is an integer ranging from 1 to 50), or —$(CF_2CF_2CF_2O)_zCF_2CF_2$— (z is an integer ranging from 1 to 50), and $M^+$ represents $Na^+$, $K^+$, $Li^+$, $H^+$, $CH_3(CH_2)_nNH_3^+$ (n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50);

<Formula 13>

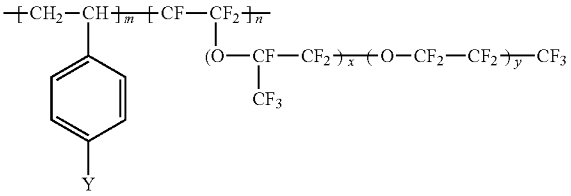

wherein m and n are $0\leq m<10{,}000{,}000$, and $0<n\leq 10{,}000{,}000$, respectively, x and y are each independently an integer ranging from 0 to 20, Y is each independently one selected from the group consisting of —$SO_3^-M^+$, —$COO^-M^+$, —$SO_3^-NHSO_2CF_3^+$, or —$PO_3^{2-}(M^+)_2$, and $M^+$ represents $Na^+$, $K^+$, $Li^+$, $H^+$, $CH_3(CH_2)_nNH_3^+$;

(n is an integer ranging from 0 to 50), $NH_4^+$, $NH_2^+$, $NHSO_2CF_3^+$, $CHO^+$, $C_2H_5OH^+$, $CH_3OH^+$, or $RCHO^+$ (R is $CH_3(CH_2)_n$—; and n is an integer ranging from 0 to 50).

8. The conductive thin film of claim 1, wherein the first fluorine-based material and the second fluorine-based material are each independently a fluorine-based polymer containing a repeating unit represented by one of Formulas 14 to 19:

<Formula 14>

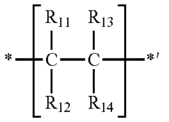

<Formula 15>

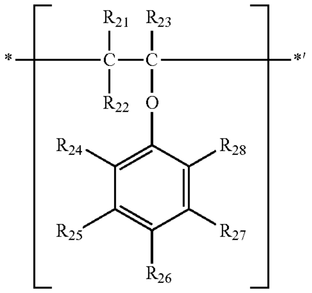

<Formula 16>

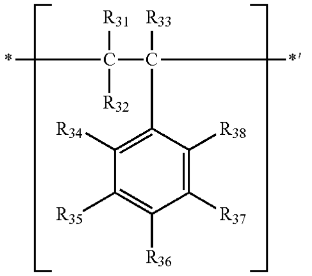

<Formula 17>

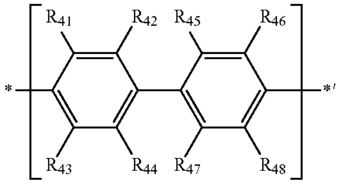

<Formula 18>

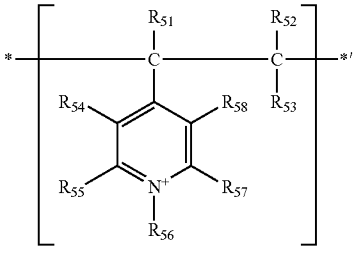

<Formula 19>

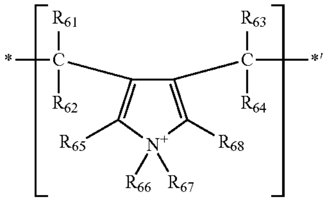

wherein $R_{11}$ to $R_{14}$, $R_{21}$ to $R_{28}$, $R_{31}$ to $R_{38}$, $R_{41}$ to $R_{48}$, $R_{51}$ to $R_{58}$, and $R_{61}$ to $R_{68}$ are each independently selected from the group consisting of hydrogen, —F, a $C_1$-$C_{20}$ alkyl group, a $C_1$-$C_{20}$ alkoxy group, a $C_1$-$C_{20}$ alkyl group substituted with at least one —F, a $C_1$-$C_{20}$ alkoxy group substituted with at least, one —F, $Q_1$, —O—$(CF_2CF(CF_3)$—$O)_n$—$(CF_2)_m$-$Q_2$ (where n and m are each independently an integer ranging from 0 to 20, provided that the sum of n and m is greater than or equal to 1), and —$(OCF_2CF_2)_x$-$Q_3$ (where x is an integer ranging from 1 to 20), provided that:

i) at least one of $R_{11}$ to $R_{14}$ in Formula 14, ii) at least one of $R_{21}$ to $R_{28}$ in Formula 15, iii) at least one of $R_{31}$ to $R_{38}$ in Formula 16, iv) at least one of $R_{41}$ to $R_{48}$ in Formula 17, v) at least one of $R_{51}$ to $R_{58}$ in Formula 18, and v) at least one of $R_{61}$ to $R_{68}$ in Formula 19 are selected from the group consisting of —F, a $C_1$-$C_{20}$ alkyl group substituted with at least one —F, a $C_1$-$C_{20}$ alkoxy group substituted with at least one —F, —O—$(CF_2CF(CF_3)$—$O)_n$—$(CF_2)_m$-$Q_2$, and —$(OCF_2CF_2)_x$-$Q_3$, and $Q_1$ to $Q_3$ are each independently an ionic group.

9. The conductive thin film of claim 1, wherein the first fluorine-based material and the second fluorine-based material are each independently a fluorinated oligomer represented by the following Formula 20:

$X\text{-}M^f_n\text{-}M^h_m\text{-}M^a_r\text{-}G$ <Formula 20> wherein X is an end group;

$M^f$ represents a unit derived from a fluorinated monomer obtained from a condensation reaction of a perfluoropolyether alcohol, polyisocyanate, and an isocyanate-reactive non-fluorinated monomer or a fluorinated $C_1$-$C_{10}$ alkylene group;

$M^h$ represents a unit derived from a non-fluorinated monomer;

$M^a$ represents a unit containing a silyl group represented by —$Si(Y_4)(Y_5)(Y_6)$;

$Y_4$, $Y_5$, and $Y_6$ each independently represent a substituted or unsubstituted $C_1$-$C_{20}$ alkyl group, a substituted or unsubstituted $C_6$-$C_{30}$ aryl group, or a hydrolyzable substituent, provided that at least one of $Y_4$, $Y_5$, and $Y_6$ is the hydrolyzable substituent;

G is a monovalent organic group containing a residue of a chain transfer agent;

n is an integer ranging from 1 to 100;

m is an integer ranging from 0 to 100; and r is an integer ranging from 0 to 100;

provided that the sum of n, m, and r is, at least 2.

10. The conductive thin film of claim 1, wherein the first fluorine-based material and the second fluorine-based material are different from each other, and an interlayer comprising the conductive polymer, the first fluorine-based material, and the second fluorine-based material is sandwiched between the conductive layer and the surface energy-tuning layer.

11. The conductive thin film of claim 10, wherein the concentration of the first fluorine-based material and the second fluorine-based material included in the interlayer forms a gradient decreasing in accordance with a direction from the surface energy-tuning layer to the conductive layer.

12. The conductive thin film of claim 1, wherein the conductive thin film has a conductivity of $1\times10^{-7}$ S/cm to $1\times10^{6}$ S/cm when the conductive thin film has a thickness of 100 nm.

13. The conductive thin film of claim 1, wherein the conductive layer further comprises at least one additive selected from the group consisting of carbon nanotubes, graphene, reduced graphene oxide, metal nanowires, metal carbon nanodots, semiconductor quantum dots, semiconductor nanowires, and metal nanodots.

14. A method for producing the conductive thin film as defined in claim 1, the method comprising:

providing a first mixture, which comprises a conductive polymer, a first fluorine-based material, and a first solvent, onto a substrate and removing at least a portion of the first solvent to form a conductive layer; and providing a second mixture, which comprises a second fluorine-based material and a second solvent, onto the conductive layer and removing at least a portion of the second solvent to form a surface energy-tuning layer.

15. The method of claim 14, wherein a first layer comprising the conductive polymer, the first fluorine-based material, the second fluorine-based material, and the second solvent, and a second layer comprising the second fluorine-based material and the second solvent are formed when the second mixture comprising the second fluorine-based material and the second solvent is provided onto the conductive layer during the formation of the surface energy-tuning layer, and an interlayer film comprising the conductive polymer, the first fluorine-based material, and the second fluorine-based material, and a surface energy-tuning layer comprising the second fluorine-based material, but not comprising the conductive polymer are formed at the same time by removing the second solvent.

16. An organic light-emitting device comprising:

an anode;

a cathode disposed to counter the anode;

a light emitting layer sandwiched between the anode and the cathode; and the conductive thin film defined in claim 1 and sandwiched between the anode and the light emitting layer, wherein the conductive layer included in the conductive thin film is disposed at a side of the anode, and the surface energy-tuning layer included in the conductive thin film is disposed at a side of the light emitting layer.

17. An organic light-emitting device comprising:

the conductive thin film defined in claim 1 and serving as an anode;

a cathode disposed to counter the anode; and a light emitting layer sandwiched between the anode and the cathode, wherein the surface energy-tuning layer included in the conductive thin film is disposed at a side of the light emitting layer.

18. The organic light-emitting device of claim 17, wherein an auxiliary conductive thin film layer comprising at least one selected from the group consisting of a conductive polymer, metallic carbon nanotubes, graphene, reduced graphene oxide, metal nanowires, a metal grid, carbon nanodots, semiconductor nanowires, and metal nanodots is further formed on a bottom surface of a conductive layer of the conductive thin film serving as the anode.

19. An organic solar cell comprising:

an anode;

a cathode disposed to counter the anode;

a heterojunction layer sandwiched between the anode and the cathode; and the conductive thin film defined in claim 1 and sandwiched between the anode and the heterojunction layer, wherein the conductive layer included in the conductive thin film is disposed at a side of the anode, and the surface energy-tuning layer included in the conductive thin film is disposed at a side of the heterojunction layer.

20. An organic solar cell comprising:

the conductive thin film defined in claim 1 and serving as an anode;

a cathode disposed to counter the anode; and a heterojunction layer sandwiched between the anode and the cathode, wherein the surface energy-tuning layer included in the conductive thin film is disposed at a side of the heterojunction layer.

21. The organic solar cell of claim 20, wherein an auxiliary conductive thin film layer comprising at least one selected from the group consisting of a conductive polymer, metallic carbon nanotubes, graphene, reduced graphene oxide, metal nanowires, a metal grid, carbon nanodots, semiconductor nanowires, and metal nanodots is further formed on a bottom surface of a conductive layer of the conductive thin film serving as the anode.

* * * * *